United States Patent
Aoshima

(10) Patent No.: US 6,566,035 B1
(45) Date of Patent: May 20, 2003

(54) NEGATIVE-TYPE IMAGE RECORDING MATERIAL AND PRECURSOR FOR NEGATIVE-TYPE LITHOGRAPHIC PRINTING PLATE

(75) Inventor: Keitaro Aoshima, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 137 days.

(21) Appl. No.: 09/696,974

(22) Filed: Oct. 27, 2000

(30) Foreign Application Priority Data

Oct. 29, 1999 (JP) .......................... 11-308286
Nov. 1, 1999 (JP) .......................... 11-310623

(51) Int. Cl.$^7$ ............................. G03F 7/004
(52) U.S. Cl. ................. 430/270.1; 430/281.1; 430/302; 430/944
(58) Field of Search ............... 430/281.1, 944, 430/302, 270.1; 522/31, 96, 107, 114

(56) References Cited

U.S. PATENT DOCUMENTS

| | | | | |
|---|---|---|---|---|
| 5,658,708 A | * | 8/1997 | Kondo | 430/288 |
| 6,013,412 A | * | 1/2000 | Aoshima | 430/270.1 |
| 6,309,792 B1 | * | 2/2000 | Hauck et al. | 430/270.1 |

FOREIGN PATENT DOCUMENTS

| | | |
|---|---|---|
| EP | 0438123 | 7/1991 |
| EP | 0784233 | 7/1997 |
| JP | 7-103171 | 11/1995 |
| JP | 9-34110 | 2/1997 |

* cited by examiner

Primary Examiner—Rosemary Ashton
(74) Attorney, Agent, or Firm—Burns, Doane, Swecker & Mathis, LLP

(57) ABSTRACT

A negative-type recording material recordable by the irradiation of an infrared ray is provided. The recording material includes (A) an infrared absorbent, (B) an onium salt, (C) a radical polymerizing compound, and (D) a binder polymer. The infrared absorbent (A) includes at least one cyanine dye having a partial structure represented by following formula (I):

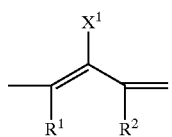

Formula (I)

wherein $X^1$ represents a halogen atom or $X^2$—$L^1$ (wherein $X^2$ represents an oxygen atom or a sulfur atom and $L^1$ represents a hydrocarbon group having from 1 to 12 carbon atoms; and $R^1$ and $R^2$ each independently represents a hydrocarbon group having from 1 to 12 carbon atoms, and $R^1$ and $R^2$ may bind together to form a ring structure). Also provided is a negative-type lithographic printing plate precursor including a support having formed thereon a photosensitive layer containing (A) an infrared absorbent, (B) an onium salt, (C) a radical polymerizing compound, and (D) a binder polymer. Absorbance of the photosensitive layer is described.

22 Claims, No Drawings

NEGATIVE-TYPE IMAGE RECORDING MATERIAL AND PRECURSOR FOR NEGATIVE-TYPE LITHOGRAPHIC PRINTING PLATE

BACKGROUND OF THE INVENTION

1. Field of the Invention

The present invention relates to an image recording material which can be used as a precursor for a lithographic printing plate, a color proof, a photoresist, and a color filter. Particularly, the invention relates to a negative-type image recording material which can be used as a lithographic printing plate precursor which can be used in so-called direct plate making, that is, which enables direct formation of a printing plate by scanning an infrared laser based on digital signals of a computer or the like, and also relates to a lithographic printing plate precursor which can be used in direct plate making.

2. Description of the Related Art

As systems of direct plate making from digital data of computers, there have hitherto been proposed (1) a system using an electrophotographic process, (2) a system using photopolymerization by exposure using a laser emitting blue or green light, (3) a system of laminating a silver salt layer on a photosensitive resin, (4) a system using a silver salt diffusion transfer process, and the like.

However, in the system (1) using the electrophotographic process, the processes of image formation such as charging, light exposure, development, etc., are complicated and the apparatus becomes complicated and large. Also, in the system (2) utilizing photopolymerization, since printing plates having a high sensitivity to blue or green light are used, handling of the printing plates in the dark becomes difficult. Also, in the systems (3) and (4), since silver salts are used, there are drawbacks in that processes such as a development and the like, are complicated and in that the waste liquids contain silver.

On the other hand, the recent progress of laser technology is remarkable, and in particular, high-output and small-sized solid-state lasers and semiconductor lasers emitting infrared rays having wavelengths of from 760 nm to 1200 nm have become easily available. These lasers are very useful as the recording light source used at the time of direct plate making from the digital data of computers. However, because the photosensitive wavelength of many photosensitive recording materials which are useful for practical use is in the visible light region of not longer than 760 nm, these recording materials cannot be used for the recording of images by these infrared lasers. Therefore, materials recordable by the infrared lasers have been desired.

As an image recording material recordable by such infrared lasers, there is a recording material comprising an onium salt, a phenol resin, and a spectral sensitizer described in U.S. Pat. No. 4,708,925. The image recording material is a positive-type image recording material utilizing a dissolution suppressing effect on a developer, which is generated by the onium salt and the phenol resin, and is not a negative-type image recording material as that of the present invention. On the other hand, as a negative-type image recording material, a recording material comprising an infrared absorbent, an acid generating agent, a resol resin, and a novolac resin is described in U.S. Pat. No. 5,340,699. However, such a negative-type image recording material requires a heat treatment after the laser exposure in order to form images, and thus a negative-type image recording material which does not require a heat treatment after exposure has been desired.

For example, in Japanese Patent Application Publication (JP-B) No. 7-103171, a recording material comprising a cyanine dye having a specific structure, an iodonium salt, and an addition-polymerizable compound having an ethylenically unsaturated double bond, which does not require a heat treatment after image-wise light exposure, is disclosed. However, in this image recording material, the strength of the formed image portions is low. Thus, there is a problem that when the recording material is used as a lithographic printing plate, only a small number of prints is obtained at the time of printing. Furthermore, the storage stability of the coating liquid for the image recording layer is insufficient, and when the coating liquid for the image recording layer has been stored over a long period of time and a lithographic printing plate is then prepared, stains occur in the non-image portions in the printing after forming images on the lithographic printing plate. Further, the strength of the image portions is very low, and few prints are obtained.

SUMMARY OF THE INVENTION

A first object of the present invention is to provide a negative-type image recording material which can be directly recorded from digital data of a computer or the like by recording using a solid-state laser or a semiconductor laser emitting an infrared ray, and which has excellent printing durability which enables obtaining many good prints without applying a heat treatment during image formation in the case in which the image recording material is used as a lithographic printing plate. Furthermore, the object is to provide a negative-type image recording material wherein the coating liquid for the recording layer has excellent storage stability and can be stored for a long period of time.

As the result of various investigations focusing on the constitutent components of negative-type recording materials, the present inventors have found that the above-described object can be attained by using a cyanine dye having a specific partial structure as the infrared absorbent, and the present inventors thus accomplished the present invention.

That is, the negative-type image recording material of the present invention is a negative-type image recording material for recording images thereon by the irradiation with infrared light, the image recording material comprising (a) an infrared absorbent, (b) an onium salt, (c) a radical polymerizing compound, and (d) a binder polymer, wherein a cyanine dye having the partial structure shown by following formula (I) is used as the infrared absorbent (A):

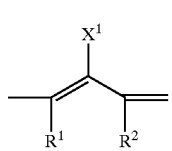

(I)

wherein $X^1$ represents a halogen atom or $X^2$—$L^1$ (wherein $X^2$ represents an oxygen atom or a sulfur atom and $L^1$ represents a hydrocarbon group having from 1 to 12 carbon atoms), and $R^1$ and $R^2$ each independently represents a hydrocarbon group having from 1 to 12 carbon atoms, and $R_1$ and $R_2$ may bind together to form a ring structure.

Although the mechanism of the present invention is unclear, it is assumed that radical polymerization by the decomposition of the onium salt and the radical polymerization reaction following thereafter sufficiently proceed merely due to the heat generated by irradiation of an infrared laser because of use of this infrared absorbent having the above partial structure, which infrared absorbent exhibits an excellent exothermic property when irradiated by an infrared laser. Thus, images, which have sufficient printing durability, can be formed without carrying out a post heat treatment.

A second object of the present invention is to provide a precursor for a negative-type lithographic printing plate which enables direct recording from digital data of a computer or the like by recording using a solid-state laser or a semiconductor laser emitting an infrared ray, and further has excellent printing durability which allows many good prints to be obtained during printing.

As the result of various investigations focusing on the absorbance, with respect to infrared rays, of precursors for negative-type lithographic printing plates, the present inventors have found that by controlling the absorbance of the photosensitive layer to a definite range, the above-described object can be attained, and have accomplished the present invention.

That is, the negative-type lithographic printing plate precursor of the present invention is a negative-type lithographic printing plate precursor, comprising a support having formed thereon a photosensitive layer containing (a) an infrared absorbent, (b) an onium salt, (c) a radical polymerizing compound, and (d) a binder polymer, wherein absorbance of the photosensitive layer at a wavelength of maximum absorption in a range of wavelengths of from 760 nm to 1200 nm is in a range of from 0.5 to 1.2 according to by a reflection measurement technique.

The mechanism of the present invention is not clear, but is assumed to be as follows. By adjusting the absorbance of the photosensitive layer to the range of from 0.5 to 1.2 by controlling the amount of the infrared absorbent and the thickness of the photosensitive layer, the photosensitive layer can sufficiently absorb irradiated infrared ray. Further, the infrared ray reaches not only the outermost surface of the photosensitive layer, but also the deep portions in the vicinity of the support, which results in the radical polymerization sufficiently proceeding in the entire photosensitive layer. In the vicinity of the support as well, the adhesive force between the support and the photosensitive layer due to the radical polymerization is sufficiently obtained. Thus, a lithographic printing plate having excellent printing durability can be obtained.

DESCRIPTION OF THE PREFERRED EMBODIMENTS

The present invention will be described in detail hereinafter.

First, the 1st embodiment of the invention is described below in detail.

[(A) Cyanine dye having the partial structure shown by the formula (I)]

In the present invention, the cyanine dye having the partial structure shown by the formula (I) described above is used as the infrared absorbent. In the formula (I), $X^1$ represents a halogen atom or $X^2$—$L^1$ (wherein $X^2$ represents an oxygen atom or a sulfur atom and $L^1$ represents a hydrocarbon group having from 1 to 12 carbon atoms), and $R^1$ and $R^2$ each independently represents a hydrocarbon group having from 1 to 12 carbon atoms. From the storage stability of the coating liquid for the recording layer, the $R^1$ and $R^2$ are preferably hydrocarbon groups each having from 2 to 12 carbon atoms and further it is more preferred that $R^1$ and $R^2$ combine each other to form a 5-membered or 6-membered ring.

As the cyanine dye having the partial structure shown by the formula (I), which is suitably used in the invention, there are compounds shown by following formula (II)

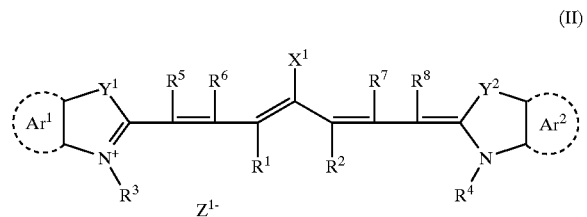

(II)

In the formula, $X^1$, $R^1$, and $R^2$ have the same meaning as those of the formula (I). $Ar^1$ and $Ar^2$, which may be the same or different, each represents an aromatic hydrocarbon group which may have a substituent. The preferred aromatic hydrocarbon group includes a benzene ring and a naphthalene ring. Also, the preferred substituent includes a hydrocarbon group having not more than 12 carbon atoms, a halogen atom, and an alkoxy group having not more than 12 carbon atoms. $Y^1$ and $Y^2$, which may be the same or different, each represents a sulfur atom or a diallylmethylene group having not more than 12 carbon atoms. $R^3$ and $R^4$, which may be the same or different, each represents a hydrocarbon group having not more than 20 carbon atoms, which may have a substituent. The preferred substituent includes an alkoxy group having not more than 12 carbon atoms, a carboxyl group, and a sulfo group. $R^5$, $R^6$, $R^7$, and $R^8$, which may be the same or different, each represents a hydrogen atom or a hydrocarbon group having not more than 12 carbon atoms, and is preferably a hydrogen atom from the easily availability of the raw material thereof. Also, $Z^1$ represents a counter anion. However, when a sulfo group is substituted to one of $R^1$ to $R^8$, $Z^1$ is unnecessary. From the storage stability of the coating liquid of the recording layer, preferred $Z^1$ includes a halogen ion, a perchlorate ion, a tetrafluoroborate ion, a hexafluorophosphate ion, and a sulfonate ion and particularly preferred $Z^1$ includes a perchlorate ion, a hexafluorophosphate ion, and an arylsulfonate ion.

Practical examples ([IR-1] to [IR-17]) of the cyanine dye having the partial structure shown by the formula (I), which can be suitably used in the invention are shown below but the invention is not limited to these compounds. In addition, in these practical examples, practical examples [IR-1] to [IR-12] are the cyanine dyes shown by the above-described formula (II).

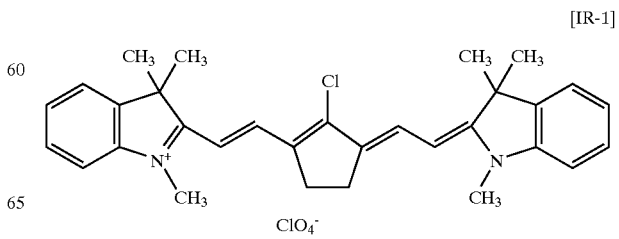

[IR-1]

[IR-2]
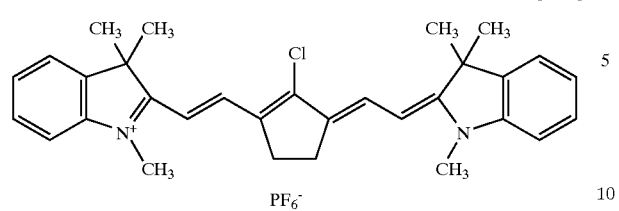
[IR-3]
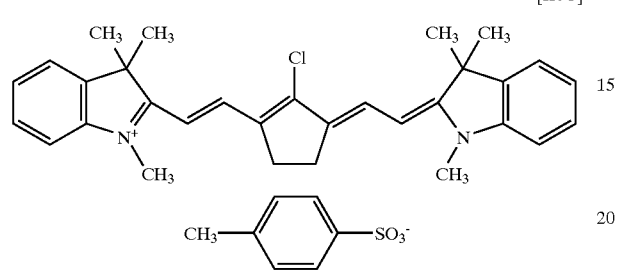
[IR-4]
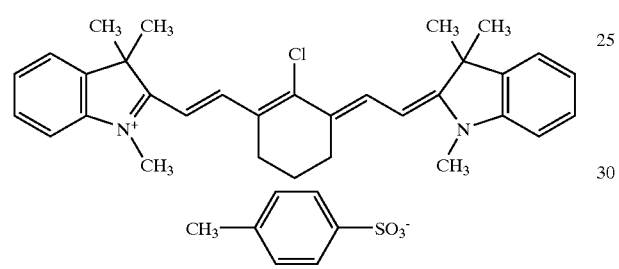
[IR-5]
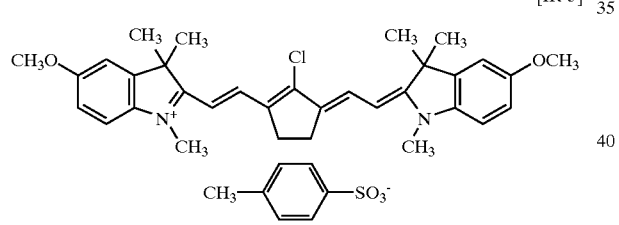
[IR-6]
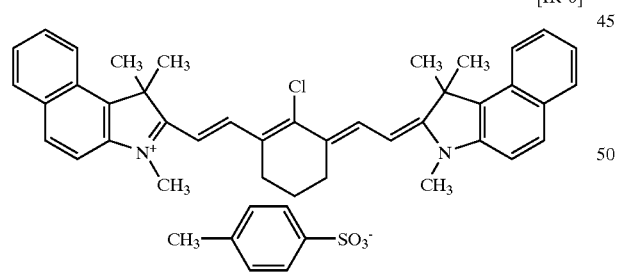
[IR-7]
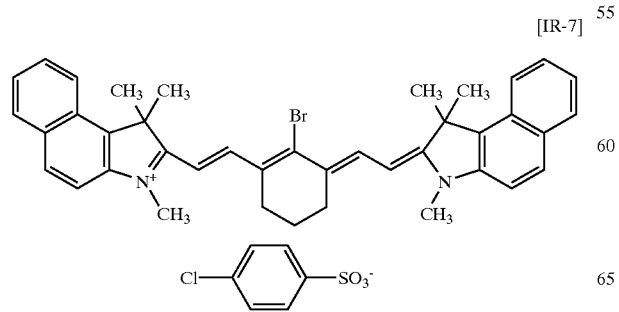
[IR-8]
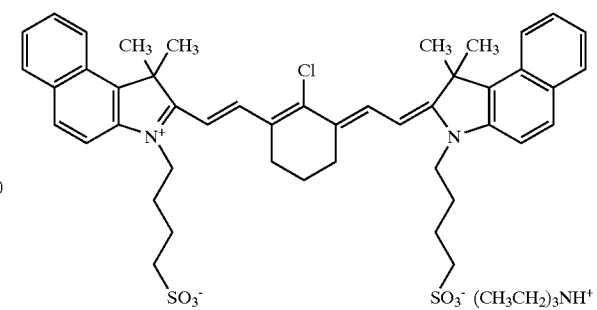
[IR-9]
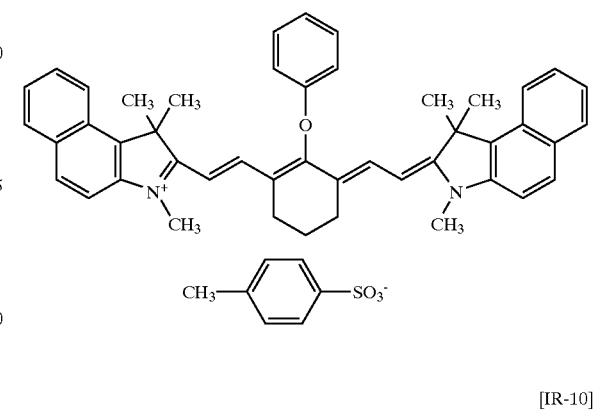
[IR-10]
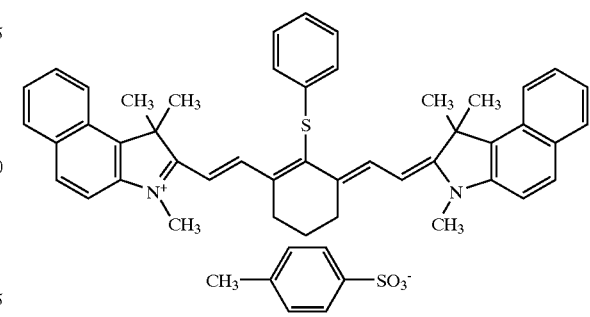
[IR-11]
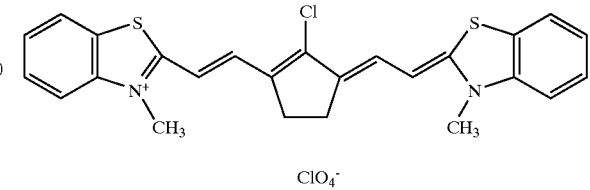
[IR-12]
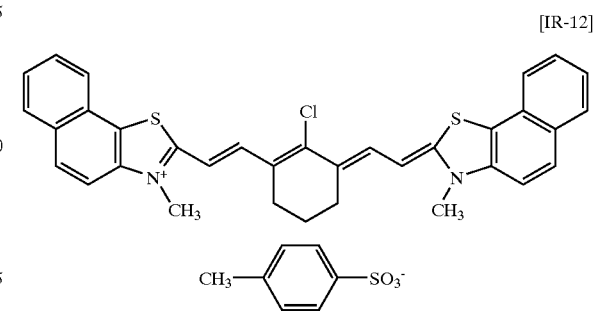

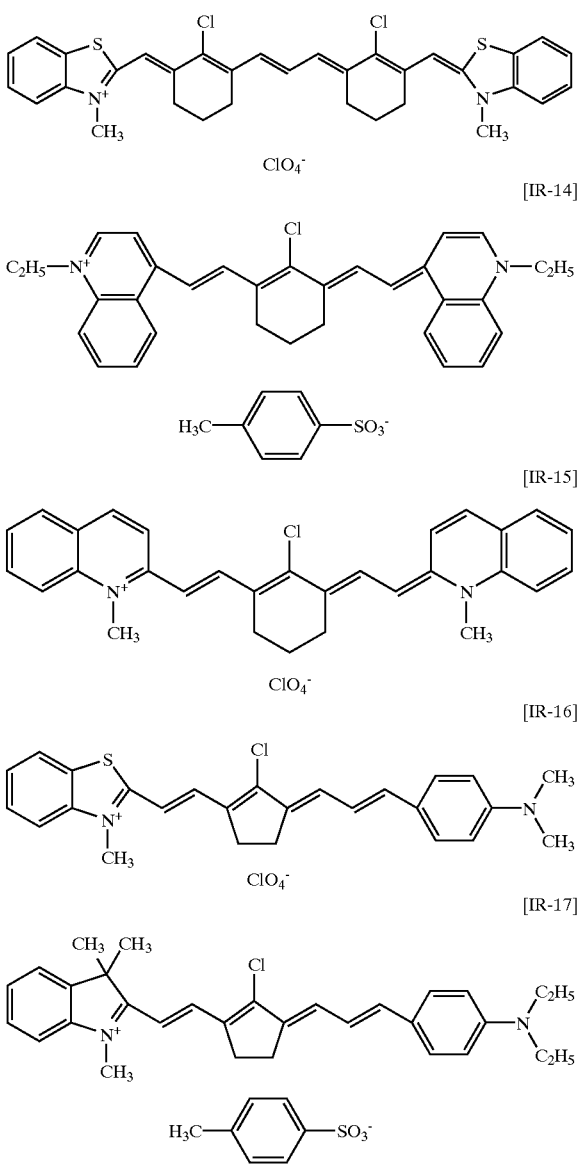

When the cyanine dye having the partial structure shown by the formula (I) is used, the storage stability of the coating liquid of the recording layer is greatly improved as compared with the case of-using a cyanine dye which does not have such a partial structure. The reason has not yet been clarified but it is supposed that by the synergistic effect of an electronic factor by the inductive effect of the halogen atom, the oxygen atom, and the sulfur atom and the steric factor by $R_1$ and $R_2$, the reaction with the onium salt in the coating liquid of the recording layer is restrained.

The cyanine dye described above is added into the image recording material in a ratio of from 0.01 to 50% by weight, preferably from 0.1 to 20% by weight, and particularly preferably from 1 to 10% by weight to the total solid components of the image recording material. When the addition amount thereof is less than 0.01% by weight, the sensitivity becomes low, and when the addition amount thereof exceeds 50% by weight, stains generate at the non-image portions at printing.

Also, when the image recording material is prepared using the cyanine dye, it is preferred that the optical density at the absorption maximum in the infrared region is in the range of from 0.1 to 3.0. When the optical density is outside the range, there is a tendency of lowering the sensitivity. Since the optical density is determined by the addition amount of the above-described infrared absorbent and the thickness of the recording layer, the definite optical density is obtained by controlling the conditions of both the factors. The optical density of the recording layer can be measured by an ordinary method. As the measurement method, there are, for example, a method of forming the recording layer having a properly determined thickness in the range that the coated amount after drying is necessary as a lithographic printing plate on a transparent or white support and measuring by a transmission type optical densitometer, a method of forming the recording layer on a reflective support such as aluminum, etc., and measuring the reflected density, etc.

These cyanine dyes may be used singly or as a mixture of two or more kinds thereof. Also, the cyanine dye(s) may be added to the same layer as other components or a different layer is formed and the cyanine dye(s) may be added to the layer.

Next, the 2nd embodiment of the invention is described below in detail.

[(A) Infrared absorbent]

The object of the invention is to record images by a laser emitting an infrared ray. For the purpose, it is inevitable to use an infrared absorbent. An infrared absorbent has a function of converting the absorbed infrared ray to heat. By the heat generated in this case, the onium salt is decomposed and a radical is generated. The infrared absorbent used in the invention is a dye or a pigment having the absorption maximum in the range of the wavelengths of from 760 nm to 1200 nm.

As the dye, commercially available dyes and known dyes described, for example, in "Senryo Binran (Dye Handbook)" edited by Yuki Gosei Kagaku Kyokai (Organic Synthetic Chemistry Association), published in 1970 can be utilized. Practical examples of dyes include azo dyes, metal complex azo dyes, pyrazolone azo dyes, naphthoquinone dyes, anthraquinone dyes, phthalocyanine dyes, carbonium dyes, quinoneimine dyes, methyne dyes, cyanine dyes, squarylium dyes, pyrylium salts, and metal thiolate complexes.

Examples of the preferred dyes include the cyanine dyes described in Japanese Patent Application Laid-Open (JP-A) Nos. 58-125246, 59-84356, 59-202829, 59-78787, etc.; the methine dyes described in Japanese Patent Application Laid-Open (JP-A) Nos. 58-173696, 58-181690, 58-194595, etc.; the naphthoquinone dyes described in Japanese Patent Application Laid-Open (JP-A) Nos. 58-112793, 58-224793, 59-48187, 59-73996, 60-52940, 60-63744, etc.; the squarylium dyes described in Japanese Patent Application Laid-Open (JP-A) No. 58-112792, etc.; and the cyanine dyes described in U.K. Patent 434,875.

Also, the near infrared absorbing sensitizers described in U.S. Pat. No. 5,156,938 are suitably used, and also the substituted aryl benzo(thio)pyrylium salts described in U.S. Pat. No. 3,881,924; the trimethyne thiapyrylium salts described in Japanese Patent Application Laid-Open (JP-A) No. 57-142645 (U.S. Pat. No. 4,327,169); the pyrylium-base compounds described in Japanese Patent Application Laid-Open (JP-A) Nos. 58-181051, 58-220143, 59-41363, 59-84248, 59-84249, 59-146063, 59-146061, etc.; the cyanine dyes described in Japanese Patent Application Laid-Open (JP-A)No. 59-216146; the pentamethyne thiopyrylium salts described in U.S. Pat. No. 4,283,475; and the pyrylium compounds disclosed in Japanese Patent Application Publication (JP-B) Nos. 5-13514 and 5-19702 are preferably used in the invention.

Also, as other examples of the preferred dyes, there are the near infrared absorbing dyes described as the formulae (I) and (II) in U.S. Pat. No. 4,756,993.

In these dyes, particularly preferred dyes include the cyanine dyes, the squarylium dyes, the pyrylium salts, the nickel thiolate complexes. Furthermore, the cyanine dyes are preferred and particularly, the cyanine dyes shown by the above-described formula (II) are most preferred.

Practical examples of the cyanine dyes shown by the formula (I) suitably used in the invention are [IR-1] to [IR-12] shown by the above-described formula (II) as described above but the invention is not limited to these dyes.

As the pigments used in the invention, commercially available pigments and the pigments described in Color Index (C.I.) Binran (Manual), "Saishin Ganryo Binran (Modern Pigment Manual)", edited by Nippon Ganryo Gijutsu (Japan Pigment Technology Association), published in 1977, "Saishin Ganryo Oyo Gijutsu Kyokai (Modern Pigment Application Technology)", by CMC Press, published in 1986, and "Insatsu Ink Gijutsu (Printing Ink Technology)" by CMC Press, published in 1984 can be utilized.

As the kinds of the pigments, there are black pigments, yellow pigments, orange color pigments, brown pigments, red pigments, purple pigments, blue pigments, green pigments, fluorescent pigments, metal powder pigments, and also polymer bonded dyes. Practical examples of the pigments used in the invention include insoluble azo pigments, azo lake pigments, condensed azo pigments, chelate azo pigments, phthalocyanine-base pigments, anthraquinone-base pigments, perylene-base and perynone-base pigments, thioindigo pigments, quinacridone pigments, dioxazine pigments, isoindolinone pigments, quinophthalone pigments, colored lake pigments, azine pigments, nitroso pigments, nitro pigments, natural pigments, fluorescent pigments, inorganic pigments, and carbon black. In these pigments, carbon black is preferred.

These pigments may be used without being subjected to a surface treatment or after being subjected to a surface treatment. As the method of the surface treatment, there are a method of surface coating a resin or a wax, a method of attaching a surface active agent, a method of bonding a reactive substance (e.g., a silane coupling agent, an epoxy compound, and polyisocyanate) to the pigment surfaces, etc. The above-described surface treatment methods are described in "Kinzoku Sekken no Seishitsu to oyo (Nature and Applications of Metal Soaps)" by Sachi Press, "Insatsu Ink Gijutsu (Printing Ink Technology)" by CMC Press, published in 1984, and "Saishin Ganryo Oyo Gijutsu (Modern Pigment Application Technology)", by CMC Press, published in 1986.

The particle sizes of the pigment are in the range of preferably from 0.01 $\mu$m to 10 $\mu$m, more preferably from 0.05 $\mu$m to 1 $\mu$m, and particularly preferably from 0.1 $\mu$m to 1 $\mu$m. The particle sizes of the pigment smaller than 0.01 $\mu$m are not preferred in the point of the stability of the pigment dispersion in the coating liquid of the image photosensitive layer and also the particle sizes exceeding 10 $\mu$m are not preferred in the point of the uniformity of the image photosensitive layer.

As a method of dispersing the pigment, a known dispersion technique used for an ink production or a toner production, etc., can be used. As the dispersing machine of the pigment, there are ultrasonic dispersing machines, sand mills, attritors, pearl mills, super mills, ball mills, impellers, dispersers, KD mills, colloid mills, dynatrons, triple roll mills, press kneaders, etc. The details thereof are described in "Saishin Ganryo Oyo Gijutsu (Modern Pigment Application Technology)", by CMC Press, published in 1986.

The infrared absorbent may be added to the same layer as other components or a different layer is formed and it may be added to the layer but the infrared absorbent is added such that in the case of preparing a negative-type lithographic printing plate precursor, the absorbance of the photosensitive layer at the absorption maximum in the range of the wavelengths of from 760 nm to 1200 nm is in the range of from 0.5 to 1.2 by a reflection measurement method. In this case, the preferred range of the absorbance is from 0.6 to 1.15. When the absorbance is outside the range, the strength of the image portions is lowered and the number of prints obtained at printing is reduced. The reason thereof has not yet been clarified but it is supposed that when the absorbance is smaller than 0.5, the photosensitive layer cannot sufficiently absorb the irradiated infrared ray, and as the result thereof, the radical polymerization of the whole photosensitive layer does not sufficiently proceed. Also, it is supposed that when the absorbance is larger than 1.2, the uppermost surface only of the photosensitive layer absorbs the infrared ray and the infrared ray does not reach the vicinity of the support, and as the result thereof, the radical polymerization does not occur in the vicinity of the support, whereby the adhesive force of the support and the photosensitive layer becomes insufficient.

The absorbance of the photosensitive layer can be controlled by the amount of the infrared absorbent added to the photosensitive layer and the thickness of the photosensitive layer. The measurement of the absorbance can be carried out by an ordinary method. As the measurement method, there are, for example, a method of forming the recording layer having a properly determined thickness in the range that the coated amount after drying is necessary as a lithographic printing plate on a reflective support such as aluminum and the like, and measuring the reflected density by an optical densitometer, and a method of measuring by an optical densitometer by a reflection method using an integrating sphere.

[(B) Onium salt]

The onium salt used in the invention is an iodonium salt, a diazonium salt, and a sulfonium salt. In the invention, the onium salt functions not as an acid generating agent but an initiator of a radical polymerization. The onium salt suitably used in the invention includes the onium salts shown by following formulae (III) to (V).

(III)

(IV)

(V)

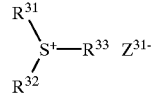

In the formula (III), $Ar^{11}$ and $Ar^{12}$ each independently represents an aryl group having not more than 20 carbon atoms, which may have a substituent. When the aryl group has a substituent, the preferred substituent includes a halogen atom, a nitro group, an alkyl group having not more than 12 carbon atoms, an alkoxy group having not more than 12 carbon atoms, and an aryloxy group having not more than 12 carbon atoms. $Z^{11}$ represents a counter ion selected from the group consisting of a halogen ion, a perchlorate ion, a tetrafluoroborate ion, a hexafluorophosphate ion, and a sulfonate ion, and $Z^{11}$ is preferably a perchlorate ion, a hexafluorophosphate ion, and an arylsulfonate ion.

In the formula (IV), $Ar^{21}$ represents an aryl group having not more than 20 carbon atoms, which may have a substituent. The preferred substituent includes a halogen atom, a nitro group, an alkyl group having not more than 12 carbon atoms, an alkoxy group having not more than 12 carbon atoms, an aryloxy group having not more than 12 carbon atoms, an alkylamino group having not more than 12 carbon atoms, a dialkylamino group having not more than 12 carbon atoms, an arylamino group having not more than 12 carbon atoms, and a diarylamino group having not more than 12 carbon atoms. $Z^{21}$ represents the counter ion same as that of $Z^{11}$.

In the formula (V), $R^{31}$, $R^{32}$, and $R^{33}$, which may be the same or different, each represents a hydrocarbon group having not more than 20 carbon atoms, which may have a substituent. The preferred substituent includes a halogen atom, a nitro group, an alkyl group having not more than 12 carbon atoms, an alkoxy group having not more than 12 carbon atoms, and an aryloxy group having not more than 12 carbon atoms. $Z^{31}$ represents the counter ion same as that of $Z^{11}$.

The practical examples of onium salts ([OI-1] to [OI-10]) shown by the formula (III), the onium salts ([ON-1] to [ON-5]) shown by the formula (IV), and the onium salts (OS-1) to [OS-5]) shown by the formula (V), which can be suitably used in the invention, are illustrated below.

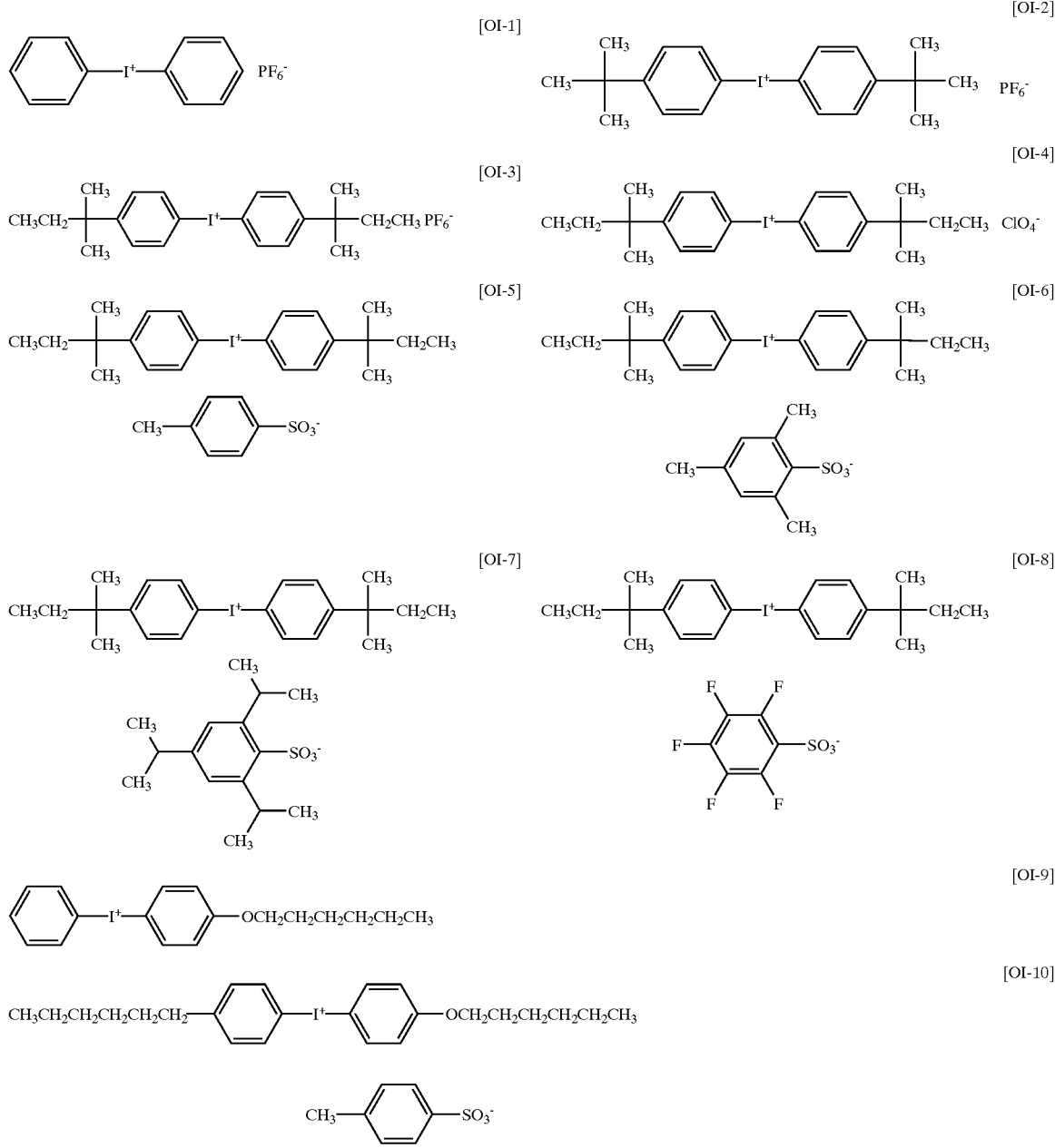

-continued
[ON-1]
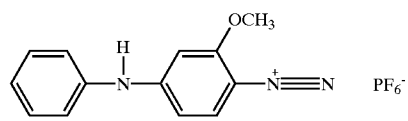
[ON-2]
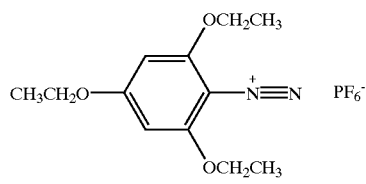
[ON-3]
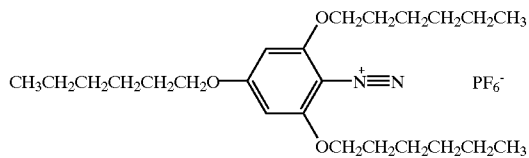
[ON-4]
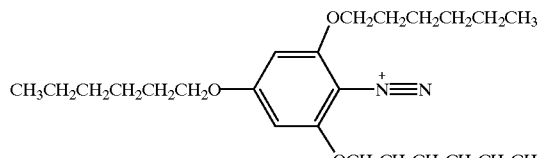
[ON-5]
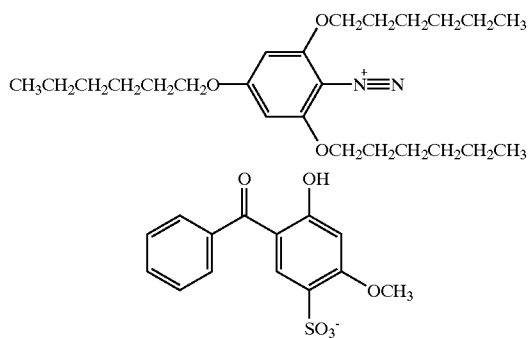
[OS-1]
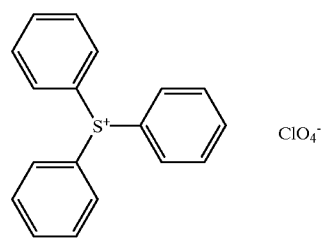
[OS-2]
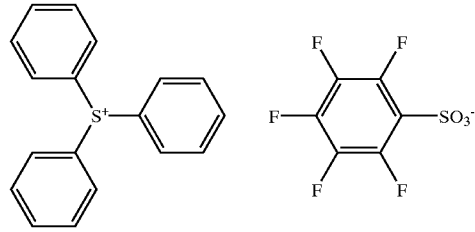
[OS-3]
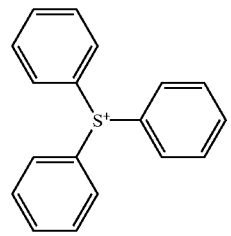 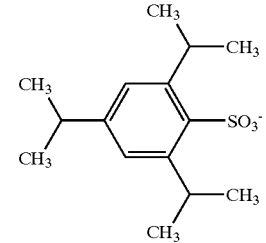
[OS-4]
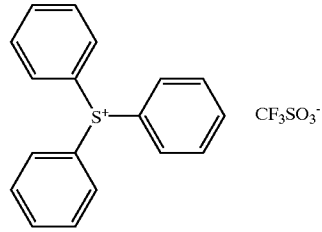
[OS-5]
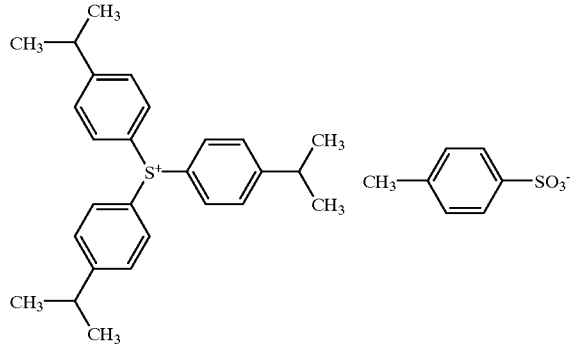

In the onium salt used in the invention, the wavelength of maximum absorption is preferably not longer than 400 nm, and more preferably not longer than 360 nm. By defining the absorption wavelength to a ultraviolet region, the image recording materials can be handled under white lamp.

The onium salt can be added into the image recording material in a ratio of from 0.1 to 50% by weight, preferably from 0.5 to 30% by weight, and particularly preferably from 1 to 20% by weight to the total solid components of the image recording material. When the addition amount of the onium salt is less than 0.1% by weight, the sensitivity is lowered, while when the addition amount exceeds 50% by weight, stains occur at non-image portions at printing. These onium salts may be used singly or as a mixture of two or more kinds. Also, the onium salt may be added to the same layer containing other components or a different layer is formed and the onium salt may be added to the additional layer.

[(c) Radical polymerizing compound]

The radical polymerizing compound used in the invention is a radical polymerizing compound having at least one ethylenically unsaturated double bond and is selected from the compounds each having at least one, and preferably at least two terminal ethylenically unsaturated double bonds. Such a compound group is widely known in the industrial field and in the invention, they can be used without particular limitation.

These compounds have chemical forms such as, for example, monomers and prepolymers, that is, dimers, trimers, and oligomers, or the mixtures of them and the copolymers of them. Examples of the monomer and the copolymer thereof include unsaturated carboxylic acids (for example, acrylic acid, methacrylic acid, itaconic acid, crotonic acid, isocrotonic acid, and maleic acid), the esters thereof, and the amides thereof. Preferably, the esters of the unsaturated carboxylic acids and aliphatic polyhydric alcohol compounds and the amines of the unsaturated carboxylic acids and aliphatic polyvalent amine compounds are used. Also, unsaturated carboxylic acid esters having a nucleophilic substituent such as a hydroxyl group, an amino group, a mercapto group, etc.; the addition reaction products of amides and monofunctional or multifunctional isocyanates or epoxides, and the dehydrated condensation reaction products of the amides and monofunctional or multifunctional carboxylic acids, etc., are suitably used in the invention. Furthermore, the addition reaction products of unsaturated carboxylic acid esters or amides each having an electrophilic substituent such as an isocyanate group, an epoxy group, etc., and monofunctional or multifunctional alcohols, amines, or thiols; and further the substituted reaction products of unsaturated carboxylic acid esters or amides each having an eliminating substituent such as a halogen group, tosyloxy group, etc., and monofunctional or multifunctional alcohols, amines, or thiols are suitably used. Also, as other examples, the compound group using unsaturated phosphonic acid, styrene, etc., in place of the above-described unsaturated carboxylic acid can be used.

Practical examples of the radical polymerizing compound which is the ester of an aliphatic polyhydric alcohol compound and an unsaturated carboxylic acid are illustrated below.

The acrylic acid esters include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanate, polyester acrylate oligomer, etc.

The methacrylic acid esters include tetramethylene glycol dimethacrylate, triethylene glycol dimethacrylate, neopentyl glycol dimethacrylate, trimethylolpropane trimethacrylate, trimethylolmethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, bis-[p-(methacryloxyethoxy)phenyl]dimethylmethane, etc.

The itaconic acid esters include ethylene glycol diitaconate, propylene glycol diitaconate, 1,3-butanediol diitaconate, 1,4-butanediol diitaconate, tetramethylene glycol diitaconate, pentaerythritol diitaconate sorbitol tetraitaconate, etc.

The crotonic acid esters include ethylene glycol dicrotonate, tetramethylene glycol dicrotonate, pentaerythritol dicrotonate, sorbitol tetradicrotonate, etc.

The isocrotonic acid esters include ethylene glycol diisocrotonate, pentaerythritol diisocrotonate, sorbitol tetraisocrotonate, etc.

The maleic acid esters include ethylene glycol dimaleate, triethylene glycol dimaleate, pentaerythritol dimaleate, sorbitol tetramaleate, etc.

As other esters, for example, the aliphatic alcohol-base esters described in Japanese Patent Application Publication (JP-B) Nos. 46-27926 and 51-47334 and Japanese Patent Application Laid-Open (JP-A) No. 57-196231; the esters each having an aromatic skeleton described in Japanese Patent Application Laid-Open (JP-A) Nos. 59-5240, 59-5241, and 2-226149, and the esters each having an amino group described in Japanese Patent Application Laid-Open (JP-A) No. 1-165613 are suitably used.

Also, practical examples of the monomer of the amide of an aliphatic polyvalent amine compound and an unsaturated carboxylic acid include methylenebis-acrylamide, methylenebis-methacrylamide, 1,6-hexamethylenebis-acrylamide, 1,6-hexamethylenebis-methacrylamide, diethylenetriamine trisacrylamide, xylylenebisacrylamide, xylylenebis-methacrylamide, etc.

As examples of other preferred amide-base monomers, there are the amide-base monomers having a cyclohexylene structure described in Japanese Patent Application Publication (JP-B) No. 54-21726.

Also, the urethane-base addition polymerizing compound produced using the addition reaction of an isocyanate and a hydroxyl group is suitably used, and as the practical examples of such a compound, there are the vinylurethane compounds each containing at least two polymerizing vinyl groups in one molecule obtained by adding the vinyl monomer having a hydroxyl group shown by following formula (VI) to a polyisocyanate compound having at least two isocyanate groups in one molecule described in Japanese patent Application publication (JP-B) No. 48-41708.

$$CH_2=C(R^{41})COOCH_2CH(R^{42})OH \qquad (VI)$$

wherein $R^{41}$ and $R^{42}$ each represents H or $CH_3$).

Also, the urethane acrylate as described in Japanese Patent Application Laid-Open (JP-A) No. 51-37193 and Japanese Patent Application Publication (JP-B) Nos. 2-32293 and 2-16765 and the urethane compounds each having an ethylene oxide-base skeleton described in Japanese Patent Application Publication (JP-B) Nos. 58-49860, 56-17654, 62-39417, and 62-39418 are suitably used.

Furthermore, the radical polymerizing compounds each having an amino structure or a sulfide structure in the molecule described in Japanese Patent Application Laid-Open (JP-A) Nos. 48-277653, 63-260909, and 1-105238 may be used in the invention.

As other examples, there are multifunctional acrylates and methacrylates such as the polyester acrylates as described in Japanese Patent Application Laid-Open (JP-A) No. 48-64183 and Japanese Patent Application Publication (JP-B) Nos. 49-43191, and 52-30490, the epoxy acrylates obtained by reacting epoxy resins and (meth)acrylic acid. Also, the specific unsaturated compounds described in Japanese Patent Application Publication (JP-B) Nos. 46-43946, 1-40337, and 1-40336, and also the vinylsulfonic acid-base compounds described in Japanese Patent Application Laid-Open (JP-A) No. 2-25493, etc., can be used. Also, as the case may be, the compounds having the structure containing a perfluoroalkyl group described in Japanese Patent Application Laid-Open (JP-A) No. 61-22048 are suitably used in the invention. Furthermore, the photo-setting monomers and oligomers described in "Nippon Setchaku Kyokai Shi (Journal of Japanese Adhesive Society)", Vol. 20, No. 7, pages 300–308 (1984) can be also used.

About these radical polymerizing compounds, the details of the using method such as the kind of the structure of the compound used, the single use or the use of a mixture, the addition amount thereof, etc., can be optionally established in conformity with the performance design of the final recording material. For example, they are selected from the following view points. That is, in the point of sensitivity, the structure having many contents of the unsaturated groups per one molecule is preferred and in many cases, at least bifunctional is preferred. Also, for increasing the strength of the image portions, that is the hardened film, at least trifunctional is preferred, and further, a method of controlling both the photosensitivity and the strength by using a combination of the compounds each having a different functionality and a different polymerizing group (e.g., an acrylic acid ester-base compound, a methacrylic acid ester-base compound, and a styrene-base compound) is effective. A compound having a large molecular weight and a compound having a high hydrophilic property are excellent in the sensitivity and the film strength but as the case may be, such a compound is undesirable in the points of a developing speed and causing depositions in a developer. Also, for the compatibility and the dispersing property with other components (e.g., a binder polymer, an initiator, and a coloring agent) in the photosensitive layer, the selection and the using method of the radical polymerizing compound is an important factor and, for example, it sometimes happens that by using a low-impurity compound or by using two or more kinds of the compounds, the compatibility thereof with other components can be improved. Also, for the purpose of improving the adhesion of the support, an overcoat layer, etc., there is a possibility that a specific structure is selected. About the compounding ratio of the radical polymerizing compound in the image recording layer, a large amount of the compound is advantageous in the point of sensitivity but when the amount is too large, an undesirable phase separation occurs, and also a problem in the production step by the stickiness of the image recording layer (for example, transfer of the components of the recording layer and production inferiority caused by sticking) and a problem of causing depositions from a developer, etc., can occur. From these view points, the preferred compounding ratio of the radical polymerizing compound is, in many cases, from 5 to 80% by weight, and preferably from 20 to 75% by weight to the total components of the composition. Also, the radical polymerizing compounds may be used singly or as a mixture of two or more kinds thereof. Furthermore, in the using method of the radical polymerizing compounds, from the view points of the extent of the polymerization hindrance to oxygen, the resolution, fogging property, the change of refractive index, the surface tackiness, etc., the appropriate structure, compounding, and addition amount can be desirably selected and further, as the case may be, the layer construction and a coating method including an undercoating and an overcoating can be practiced.

[(D) Binder polymer]

In the invention, a binder polymer is further used. As the binder, it is preferable to use a linear organic polymer. As such a "linear organic polymer", known polymers can be optionally used. Preferably, for making possible a water development or a weak-alkaline water development, a linear organic polymer which is soluble in or is swelled with water or a weak-alkaline water is selected. The linear organic polymer is selectively used as not only a film-forming agent of the image recording material but also according to the use as a water, weak-alkaline water, or organic solvent developing agent. For example, when a water-soluble organic polymer is used, a water development becomes possible. As such linear organic polymers, there are radical polymers having a carboxylic acid group at the side chain, for example, the polymers described in Japanese Patent Application Laid-Open (JP-A) No. 59-44615, Japanese Patent Application Publication (JP-B) Nos. 54-34327, 58-12577, and 54-25957, Japanese Patent Application Laid-Open (JP-A) Nos. 54-92723, 59-53836, and 59-71048, that is, there are methacrylic acid copolymers, acrylic acid copolymers, itaconic acid copolymers, crotonic acid copolymers, maleic acid copolymers, partially esterified maleic acid copolymers, etc. Also, there are acidic cellulose derivatives each having a carboxylic acid group at the side chain. As other examples, the polymers having a hydroxyl group added with a cyclic acid anhydride are also useful.

In these organic polymers, (meth)acrylic resins each having a benzyl group or an allyl group and a carboxyl group at the side chain are excellent in the balance of the film strength, the sensitivity, and the developing property and are particularly suitable.

Also, the urethane-base binder polymers each having an acid group described in Japanese Patent Application Publication (JP-B) Nos. 7-12004, 7-120041, 7-120042, and 8-12424, Japanese Patent Application Laid-Open (JP-A) Nos. 63-287944, 63-287947, and 1-271741, Japanese Patent Application Publication (JP-B) No. 10-116232, etc., are very excellent in the strength and are useful in the points of the printing durability and the low-exposure aptitude.

Furthermore, as other water-soluble linear organic polymers, polyvinyl pyrrolidone, polyethylene oxide, etc., are useful. Also, for increasing the strength of the hardened film, alcohol-soluble nylon, the polyether of 2,2-bis-(4-hydroxyphenyl)-propane and epichlorohydrin, etc., are useful.

The weight average molecular weight of the polymer used in the invention is preferably at least 5000, and more preferably in the range of from 10,000 to 300,000, and the number average molecular weight thereof is preferably at least 1000, and more preferably in the range of from 2000 to 250,000. The degree of polydispersion (weight average molecular weight/number average molecular weight) of the polymer is preferably at least 1, and more preferably in the range of from 1.1 to 10.

These polymers may be random polymers, block polymers, graft polymers, etc., but random polymers are preferable.

The polymer used in the invention can be synthesized by known methods. Examples of the solvent used for the synthesis of the polymers include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene ethyl acetate, methyl lactate, ethyl lactate, dimethyl sulfoxide, and water. These solvents are used singly or as a mixture of two or more kinds thereof.

As the radical polymerization initiator used in the case of synthesizing the polymer used in the invention, known compounds such as an azo-base initiator, a peroxide initiator, etc., can be used.

The binder polymers used in the invention may be used singly or as a mixture of them. The polymer(s) are added in the image recording material at a ratio of from 20 to 95% by weight, and preferably from 30 to 90% by weight to the total solid components of the image recording material. When the addition amount thereof is less than 20% by weight, the strength of the image portions becomes insufficient in the case of forming images. Also, when the addition amount exceeds 95% by weight, images are not formed. Also, it is preferred that the ratio of the compound having an ethylenically unsaturated double bond capable of causing a radical polymerization and the linear organic polymer are in the range of from 1/9 to 7/3.

[Other components]

In the present invention, if necessary, in addition to the above-described components, other various compounds may be added.

For example, dyes having a large absorption in a visible light region can be used as a coloring agents of images. Practical examples of the dyes include Oil Yellow #101, Oil Yellow #103, Oil pink #312, Oil Green BG, Oil Blue BOS, Oil Blue #603, Oil Black BY, Oil Black BS, Oil Black T-505 (all manufactured by Orient Chemical Industry Co., Ltd.), Victoria Pure Blue, Crystal Violet (CI 142555), Methyl Violet (CI 42535), Ethyl Violet, Rhodamine B (CI 145170B), Malachite Green (CI 142000), Methylene Blue (CI 52015), etc., and the dyes described in Japanese Patent Application Laid-Open (JP-A) No. 62-293247. Also, pigments such as phthalocyanine-base pigments, azo-base pigments, carbon black, titanium oxide, etc., can be suitably used.

It is preferred to add the coloring agent since the image portions and the non-image portions are easily distinguished after image formation. In addition, the addition amount of the coloring agent is from 0.01 to 10% by weight to the total solid components of the image recording material.

Also, in the invention, to obstruct the occurrence of an unnecessary thermal polymerization of the radical polymerizable compound having an ethylenically unsaturated double bond during the production or during the storage of the image recording material, it is desirable to add a small amount of a thermal polymerization inhibitor. The proper thermal polymerization inhibitor includes hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitroso-N-phenylhydroxylamine aluminum salt, etc. The addition amount of the thermal polymerization inhibitor is preferably from about 0.01 to 5% by weight to the weight of the whole composition. Also, if necessary, to prevent the occurrence of the polymerization hindrance by oxygen, a higher fatty acid derivative such as behenic acid and behenic acid amide is added and is unevenly distributed on the surface of the photosensitive layer in the course of drying after coating. The addition amount of the higher fatty acid derivative is preferably from about 0.1% by weight to 10% by weight to the whole composition.

Also, for widening the stability of the treatment to the fluctuation of the development condition, the nonionic surface active agents as described in Japanese Patent Application Laid-Open (JP-A) Nos. 62-251740 and 3-208514 or the amphoteric surface active agents as described in Japanese Patent Application Laid-Open (JP-A) Nos. 59-121044 and 4-13149 can be added into the image recording material in the invention.

Practical examples of the nonionic surface active agent include sorbitan tristearate, sorbitan monopalmitate, sorbitan triolate, monoglyceride stearate, and polyoxyethylene nonylphenyl ether.

Practical examples of the amphoteric surface active agent include alkyl di(aminoethyl)glycine, alkyl polyaminoethylglycine hydrochloride, 2-alkyl-N-carboxyethyl-N-hydroxyethyl imidazolinium betaine, N-tetradecyl-N,N-betaine type (for example, Amorgen K, trade name, manufactured by Dai-Ichi Kogyo Co., Ltd.).

The ratio of the above-described nonionic surface active agent or amphoteric surface active agent in the image recording material is preferably from 0.05 to 15% by weight, and more preferably from 0.1 to 5% by weight.

Moreover, if necessary, to provide a flexibility, etc., to the coated film, a plasticizer is added into the image recording material of the invention. Examples of the plasticizer used in the invention include polyethylene glycol, tributyl citrate, diethyl phthalate, dibutyl phthalate, dihexyl phthalate, dioctyl phthalate, tricresyl phosphate, tributyl phosphate, trioctyl phosphate, and tetrahydrofurfuryl oleate.

For producing a lithographic printing plate precursor from the image recording material of the invention, usually, the above-described components are dissolved in a solvent and coated on a proper support. The solvent used in this case includes ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N-dimethylacetamide, N,N-dimethylformamide, tetramethylurea, N-methylpyrrolidone, dimethyl sulfoxide, sulfolane, Y-butyrolactone, toluene, and water but the invention is not limited to these solvents. These solvents are used singly or as a mixture thereof. The concentration of the above-described components (total solid components containing additives) in the solvent is preferably from 1 to 50% by weight.

The coated amount (solid components) on the support obtained after drying the coated layer depends upon the use, but is generally preferably from 0.5 to 5.0 g/m$^2$ in regard to the lithographic printing plate precursor. As a coating method, various methods can be used and, for example, a bar coater coating method, a rotation coating method, a spray coating method, a curtain coating method, a dip coating method, an air-knife coating method, a blade coating method, and a roll coating method can be used. As decreasing the coating amount, the apparent sensitivity is increased but the film characteristics of the image recording film are lowered.

To the image recording material of the invention can be added a surface active agent for improving the coating property, such as, for example, the fluorine-base surface active agents described in Japanese Patent Application Laid-Open (JP-A) No. 62-170950. The addition amount of the surface active agent is preferably from 0.01 to 1% by weight, and more preferably from 0.05 to 0.5% by weight to the total solid components of the image recording material.

[Support]

A support on which the image recording material of the invention can be coated is a dimensionally stable plate-form materials and examples of the support include papers, papers laminated with a plastic (e.g., polyethylene, polypropylene, and polystyrene), metal plates (e.g., aluminum, zinc, and copper), plastic films (e.g., cellulose diacetate, cellulose triacetate, cellulose propionate, cellulose butyrate, cellulose acetate/butyrate, cellulose nitrate, polyethylene terephthalate, polyethylene, polystyrene, polypropylene, polycarbonate, and polyvinyl acetal), and papers or plastic films laminated or vapor-deposited with the metal as described above. As the preferred support, there are a polyester film and an aluminum plate.

When the image recording material of the invention is used as a lithographic printing plate, as the support thereof, a light-weight aluminum plate excellent in the surface treating property, the workability, and the corrosion resistance is preferably used. As the aluminum material used for the purpose, JIS 1050 material, JIS 1100 material, JIS 1070 material, Al—Mg-based alloys, Al—Mn-based alloys, Al—Mn—Mg-based alloys, Al—Zr-based alloys, Al—Mg—Si-based alloys, etc., are used.

The known technology about the aluminum materials which can be used as the support in the invention are shown below.

(1) About JIS 1050 material, the following techniques are disclosed.

Japanese Patent Application Laid-Open (JP-A) Nos. 59-153861, 61-51395, 62-146694, 60-215725, 60-215726, 60-215727, 60-215728, 61-272357, 58-11759, 58-42493, 58-221254, 62-148295, 4-254545, 4-165041, and 3-234594, Japanese Patent Application Publication (JP-B) Nos. 3-68939 and 1-47545, Japanese Patent Application Laid-Open (JP-A) No. 62-140894, etc. Also, the techniques disclosed in Japanese Patent Application Publication (JP-B) Nos. 1-35910 and 55-28874 are known.

(2) About JIS 1070 material, the following techniques are disclosed.

Japanese Patent Application Laid-Open (JP-A) Nos. 7-81264, 7-305133, 8-49034, 8-73974, 8-108659, 8-92679, etc.

(3) About Al-Mg-based alloys, the following techniques are disclosed.

Japanese Patent Application Publication (JP-B) Nos. 62-5080, 63-60823, and 3-61753, Japanese Patent Application Laid-Open (JP-A) Nos. 60-203496 and 60-203497, Japanese Patent Application Publication (JP-B) No. 3-11635, Japanese Patent Application Laid-Open (JP-A) Nos. 61-274993, 62-23794, 63-47347, 63-47348, 63-47349, 64-61293, 63-135294, and 63-87288, Japanese Patent Application Publication (JP-B) Nos. 4-73392 and 7-100844, Japanese Patent Application Laid-Open (JP-A) No. 62-149856, Japanese Patent Application Publication (JP-B) No. 4-73394, Japanese Patent Application Laid-Open (JP-A) No. 62-181191, Japanese Patent Application Publication (JP-B) No. 5-76530, Japanese Patent Application Laid-Open (JP-A) No. 63-30294, Japanese Patent Application Publication (JP-B) No. 6-37116. etc. Also, the techniques disclosed in Japanese Patent Application Laid-Open (JP-A) Nos. 2-215599 and 61-201747 are known.

(4) About Al—Mn-based alloys, the following techniques are disclosed.

Japanese Patent Application Laid-Open (JP-A) Nos. 60-230951, 1-306288, 2-293189, etc. Also, the techniques disclosed in Japanese Patent Application Publication (JP-B) Nos. 54-42284, 4-19290, 4-19291, and 4-19292, Japanese Patent Application Laid-Open (JP-A) Nos. 61-35995 and 64-51992, U.S. Pat. Nos. 5,009,722 and 5,028,276, Japanese Patent Application Laid-Open (JP-A) No. 4-226394, etc., are known.

(5) About Al—Mn—Mg-based alloy, the following techniques are disclosed.

Japanese Patent Application Laid-Open (JP-A) Nos. 62-86143 and 3-222796. Also, the techniques disclosed in Japanese Patent Application Publication (JP-B) No. 63-60824, Japanese Patent Application Laid-Open (JP-A) Nos. 60-63346 and 60-63347, EP 223737, Japanese Patent Application Laid-Open (JP-A) No. 1-283350, U.S. Pat. No. 4,818,300, U.K. Patent 1222777, etc., are known.

(6) About Al-Zr-based alloys, the following techniques are known.

Japanese Patent Application Publication (JP-B) No. 63-15978 and Japanese Patent Application Laid-Open (JP-A) Nos. 61-51395. Also, the techniques disclosed in Japanese Patent Application Laid-Open (JP-A) Nos. 63-143234, 63-143235, etc., are known.

(7) About Al—Mg—Si-based alloys, the techniques disclosed in U.K. Patent 1421710, etc., are known.

Also, As the production method of the aluminum plate for the support, the following techniques can be used.

An aluminum alloy melt containing the components or having the alloy component ratio described above is subjected to a cleaning treatment according to an ordinary method and is cast. For the cleaning treatment, to remove unnecessary gases such as hydrogen, etc., in the melt, a flux treatment, a degassing treatment using an Ar gas, a Cl gas. etc., a filtering treatment using so-called rigid media filters such as a ceramic tube filter, a ceramic foam filter, etc.; filters using alumina flakes, alumina balls, etc., as the filtering material; glass cross filters, etc., or the treatment of combining the degassing treatment and the filtering treatment is carried out. It is desirable that the cleaning treatment is practiced to prevent the occurrences of the faults caused by foreign matters such as nonmetallic interposed substances, oxides, etc., in the melt and the faults caused by the gasses melted in the melt.

About the filtering treatment of the melt, the techniques disclosed in Japanese Patent Application Laid-Open (JP-A) Nos. 6-57342, 3-162530, 5-140659, 4-231425, 4-276031, 5-311261, 6-136466, etc., are known.

About the degassing treatment of melt, the techniques disclosed in Japanese Patent Application Laid-Open (JP-A) Nos. 5-51659, 5-51660, Japanese Utility Model Application Laid-Open (JP-U) No. 5-49148, 7-40017, etc., are known.

Using the melt subjected to the cleaning treatment as described above, casting is carried out. About the casting method, there are a method of using a fixed mold typified by a DC casting method and a method of using a driving mold typified by a continuous casting method.

In the case of using the DC casting method, the melt is solidified at a cooling rate of a range of from 1 to 300°

C./second. When the cooling rate is lower than 1° C./second, many coarse intermetallic compounds are formed.

As the continuous casting method, a method of using cooling rolls typified by a Hunter method and a 3C method and a method of using a cooling belt or a cooling black such as a Hazuley method and Arswis caster type II are industrially used. When the continuous casting method is used, the melt is solidified at a cooling rate of from 100 to 1000° C./second. In general, since the cooling rate is fast as compared with the DC casting method, the continuous casting method has a feature that the solid solution forming degree of the alloy component with respect to aluminum matrix can be increased. About the continuous casting method, some techniques are disclosed by the present inventors in Japanese Patent Application Laid-Open (JP-A) Nos. 3-79798, 5-201166, 5-156414, 6-262203, 6-122949, 6-210406, 6-262308, etc.

When the DC casting is carried out, an ingot having a plate thickness of from 300 to 800 mm can be produced. Surface cutting is applied to the ingot by an ordinary method, and a surface layer of from 1 to 30 mm, preferably from 1 to 10 mm is cut off. Thereafter, if necessary, an ignition treatment is carried out. In the case of carrying out the ignition treatment, the heat treatment is applied at a temperature of from 450 to 620° C. for 1 hour or longer but 48 hours or shorter such that the intermetallic compound does not become coarse. When the heat treatment is shorter than 1 hour, the effect of the ignition treatment becomes insufficient. Then, hot rolling and cold rolling are carried out to form a rolled aluminum plate. The initiation temperature of hot rolling is in the range of from 350 to 500° C. Before, after, or during cold rolling, a process annealing treatment may be applied. In this case, as the process annealing condition, a method of heating using a batch type annealing furnace at a temperature of from 280° C. to 600° C. for from 2 to 20 hours, and preferably at a temperature of from 350 to 500° C. for from 2 to 10 hours or a method of heat treating using a continuous annealing furnace, at a temperature of from 400 to 600° C. for 360 seconds or shorter, and preferably at a temperature of from 450 to 550° C. for 120 seconds or shorter can be employed. When the rolled aluminum plate is heated using a continuous annealing furnace at a temperature raising speed of at least 10° C./second, a fine crystal texture can be obtained.

The planeness of the aluminum plate finished to a definite thickness of from 0.1 to 0.5 mm by the above-described steps, may be improved by a reforming apparatus such as roller leveler, a tension leveler, etc. The improvement of the planeness may be carried out after cutting the aluminum plate to a short form but for improving the productivity, it is preferred to carry out the improvement of the planeness thereof in a continuous coil state. Also, for working the width of the plate to a definite width, it is usually carried out to pass the aluminum plate to a slitter line. When the plate is cut by the slitter edges, the edge surfaces of the plate cut by the slitter, one or both of shearing surfaces and broken surfaces occur.

It is preferred that the accuracy of the thickness of the plate is within ±10 µm, and desirably within ±6 µm along the whole length of the coil. Also, it is preferred that the accuracy of the plate thickness difference in the width direction is within 6 µm, and desirably within 3 µm. Furthermore, it is preferred that the accuracy of the width of the plate is within ±1.0 mm, and desirably within ±0.5 mm. The surface roughness of the aluminum plate is liable to be influenced by the surface roughness of rolling rolls but it is better to finish the plate such that the center line surface roughness (Ra) becomes finally from about 0.1 to 1.0 µm. When Ra is too large, when a surface roughening treatment and coating of a photosensitive layer are carried out as for a lithographic printing plate, the original roughness of the aluminum plate, that is, the rough rolling stripe traces transferred by the rolling rolls are seen from above the photosensitive layer, which is undesirable from the view point of appearance. On the other hand, when Ra is lower than 0.1 µm, it is necessary to finish the surface of the rolling roll to an extremely low roughness, which is undesirable from an industrial view point.

Also, for preventing the generation of scratches by the friction of aluminum plates rubbed with each other, a thin oil film may be formed on the surface of the aluminum plate. As the oil film, according to the necessity, a volatile oil or a non-volatile oil is properly used. When the amount of the oil is too much, a slipping trouble occurs in the production line but when the amount of oil is zero, scratches occur during transporting the aluminum coils. Thus, the amount of the oil preferred is from 3 mg/m$^2$ to 100 mg/m$^2$, and the preferred upper limit is 50 mg/m$^2$ or less, and the more preferable upper limit is 10 mg/m$^2$ or less.

About cold rolling, the preferred technique is disclosed in Japanese Patent Application Laid-Open (JP-A) No. 6-210308, etc.

In the case of carrying out the continuous casting method, when a cooling roll of, for example, a Hunter method is used, a cast plate having a thickness of from 1 to 10 mm can be directly continuously casting rolled and a merit of omitting a hot rolling step is obtained. Also, when the cooling roll of a Hazuley method, etc., is used, a cast plate having a thickness of from 10 to 50 mm can be cast, and in general, by disposing a hot rolling roll directly after casting and continuously rolling, a continuously casting rolled plate having a thickness of from 1 to 10 mm is obtained. The continuous casting rolled plate is finished to a plate thickness of from 0.1 to 0.5 mm through the steps of cold rolling, process annealing, planeness improvement, slitting, etc., as described in the case of DC casting. The process annealing condition and cold rolling condition in the case of using the continuous casting method are disclosed in Japanese Patent Application Laid-Open (JP-A) Nos. 6-220593, 6-210308, 7-54111, 8-92709, etc.

The surface of the aluminum plate produced by the above-described method is subjected to a surface treatment such as a surface roughening treatment, etc., and coated with a photosensitive layer to provide a lithographic printing plate precursor. As the surface roughening treatment, mechanical roughening, chemical roughing, and electrochemical roughening are carried out singly or as a combination thereof. Also, it is preferred to carry out an anodizing treatment of ensuring the surface becoming hard to be scratched and to carry out the treatment for increasing the hydrophilic property of the surface.

Then, the surface treatment of an aluminum support is explained.

Prior to applying roughing to the support, if necessary, a degreasing treatment by a surface active agent, an organic solvent, or an alkaline aqueous solution for removing the rolling oil from the surface of the aluminum plate may be carried out. In the case of treating with an alkaline aqueous solution, thereafter, a neutralizing treatment with an acidic aqueous solution and a desmutting treatment may be carried out.

Then, for improving the adhesion of the support and the photosensitive layer and giving a water retention to the non-image portions, a so-called graining treatment, that is roughening the surface of the support is carried out. As the practical means for the graining treatment method, there are mechanical graining methods such as sand blast graining, ball graining, wire graining, brush graining by a nylon brush and an abrasives/water slurry, honing graining by spraying an abrasives/water slurry onto the surface of the support, and a chemical graining method of roughening treating the surface of the support with a etching agent made of an alkali or an acid, or a mixture thereof. Also, the electrochemical graining methods described in U.K. Patent 896,563, Japanese Patent Application Laid-Open (JP-A) Nos. 53-67507 and 54-146234, and Japanese Patent Application Publication (JP-B) No. 48-28123; the methods of combining a mechanical graining method and an electrochemical graining method described in Japanese Patent Application Laid-Open (JP-A) Nos. 53-123204 and 54-63902; and the method of combining a mechanical graining method and a chemical graining method with a saturated aqueous solution of the aluminum salt of a mineral acid described in Japanese Patent Application Laid-Open (JP-A) No. 56-55261 are known. Also, a rough surface may be formed on the surface of the support by a method of roughening the surface by adhering fine particles on the surface of the support with an adhesive or a method having the effect of adhering the particles or by press-contacting a continuous belt or a roll having fine unevenness on the surface to the surface of the support to transfer the unevenness onto the support.

These surface roughening methods may be applied by combining the plural methods thereof and the order thereof and the repeating number can be optionally selected. In the case of combining the plural surface roughening methods, a chemical treatment with an acid or an alkali aqueous solution can be applied between the methods so that the subsequent roughening treatment can be uniformly carried out. Practical examples of the above-described acid or alkali aqueous solution include an aqueous solution of an acid such as hydrofluoric acid, fluorozirconic acid, phosphoric acid, sulfuric acid, hydrochloric acid, nitric acid, etc., and an aqueous solution of an alkali such as sodium hydroxide, sodium silicate, sodium carbonate, etc. These acid aqueous solutions or the alkali aqueous solutions can be used singly or as a mixture of two or more kinds thereof respectively. In the chemical treatment, it is general to treat using the aqueous solution of from 0.05 to 40% by weight of the acid or the alkali at a temperature of from 40 to 100° C. for 5 to 300 seconds.

Since on the surface of the support obtained by the roughening treatment, that is, the graining treatment as described above, smuts are formed, it is generally preferred to apply a treatment of water washing or alkali etching, etc., to remove the smuts. As such a treatment, there are, for example, the alkali etching method described in Japanese Patent Application Publication (JP-B) No. 8-28123 and the sulfuric acid desmutting method described in Japanese Patent Application Laid-Open (JP-A) No. 53-12739.

In the case of the aluminum support used in the invention, after applying the pre-treatment as described above, usually, by anodizing, an oxide film is formed on the support for improving the wear resistance, the chemical resistance, and the water retention.

As an electrolyte used for the anodizing treatment of the aluminum plate, any electrolyte which can form a porous oxide film can be used and in general, sulfuric acid, phosphoric acid, oxalic acid, chromic acid, or a mixed acids thereof are used. The concentration of the electrolyte is properly determined according to the kind of the electrolyte. Since the treatment conditions of anodizing variously differ according to the kind of the electrolyte used and cannot be generally specified but in general, it is proper that the concentration of the electrolyte is from 1 to 80% solution, the liquid temperature is from 5 to 70° C., the current density is from 5 to 60 A/dm$^2$, the voltage is from 1 to 100 volts, and the electrolytic time is in the range of from 10 seconds to 5 minutes. The amount of the anodized film is in the range of preferably at least 1.0 g/m$^2$, and more preferably from 2.0 to 6.0 g/m$^2$. When the anodized film is less than 1.0 g/m$^2$, the printing durability is insufficient, and scratches are liable to form at the non-image portions of the lithographic printing plate, whereby so-called "scratch stain" of attaching an ink to the scratch portions at printing is liable to occur.

In addition, such an anodizing treatment is applied to the surface used for printing of the support of the lithographic printing plate but by turning the line of electric force to the back side of the support, an anodized film of from 0.01 to 3 g/m$^2$ is generally formed on the back surface of the support. Also, an anodizing treatment in an alkali aqueous solution (e.g., an aqueous solution of few percent sodium hydroxide) or a molten salt and an anodizing treatment of forming a non-porous anodized film using, for example, an aqueous solution of ammonium borate can be carried out.

Furthermore, before carrying out the anodizing treatment, the hydrated oxide film formation described in Japanese Patent Application Laid-Open (JP-A) Nos. 4-148991 and 4-97896 may be carried out and also the treatment in a solution of a metal silicate and the hydrated oxide film formation treatment described in Japanese Patent Application Laid-Open (JP-A) Nos. 63-56497 and 63-67295 and the formation film forming treatment described in Japanese Patent Application Laid-Open (JP-A) No. 56-144195 can be carried out.

The aluminum support in the invention can, after the anodizing treatment, be treated with an organic acid or the salt thereof or the compounds can be used as a subbing layer for coating a photosensitive layer. As the organic acid or the salt thereof, there are organic carboxylic acids, organic phosphonic acids, organic sulfonic acids, and the salts of them, but organic carboxylic acids or the salts thereof are preferred. Examples of the organic carboxylic acid include aliphatic monocarboxylic acids such as formic acid, acetic acid, propionic acid, butyric acid, lauric acid, palmitic acid, stearic acid, etc.; unsaturated aliphatic monocarboxylic acids such as oleic acid, linolic acid, etc.; aliphatic dicarboxylic acids such as oxalic acid, succinic acid, adipic acid, maleic acid, etc.; oxycarboxylic acids such as lactic acid, gluconic acid, malic acid, tartaric acid, citric acid, etc.; aromatic carboxylic acids such as benzoic acid, mandelic acid, salicylic acid, phthalic acid, etc.; and the metal salts thereof of groups Ia, IIb, IIIb, IVa. VIb, and VIII and the ammonium salts thereof. In the above-described organic carboxylates, the preferred salts are the above-described metal salts and the ammonium salts of formic acid, acetic acid, butyric acid, propionic acid, lauric acid, oleic acid, succinic acid, and benzoic acid. These compounds may be used singly or as a combination of two or more kinds thereof.

It is preferable that the above-described compound is dissolved in water or an alcohol at a concentration of from 0.001 to 10% by weight, and particularly from 0.01 to 1.0% by weight, and as the treatment conditions, the support is immersed in the treatment liquid or coated with the treatment liquid at a temperature range of from 25 to 95° C., preferably from 50 to 95° C., a pH of from 1 to 13, preferably from 2 to 10, and for from 10 seconds to 20 minutes, preferably from 10 seconds to 3 minutes.

Also, furthermore, after the anodizing treatment, the aluminum support can be used for the treatment with a solution of the following compounds and these compounds can be used as a subbing layer for coating the photosensitive layer. Examples of the compound suitable used include organic phosphonic acids such as phenylphosphonic acid, naphthylphosphonic acid, ailkylphosphonic acid, glycerophosphonic acid, methylenediphosphonic acid, and ethylenediphosphonic acid each may have a substituent; organic phosphoric acids such as phenylphosphoric acid, naphthylphosphoric acid, alkylphosphoric acid, and glycerophosphoric acid each may have a substituent; organic phosphinic acids such phenylphosphinic acid, naphthylphosphinic acid, alkylphosphinic acid, and glycerophosphinic acid each may have a substituent; amino acids such as glycine, P-alanine, valine, serine, threonine, aspartic acid, glutamic acid, arginine, lysine, triptophan, parahydroxyphenylglycine, dihydroxyethylglycine, anthranilic acid, etc.; aminosulfonic acids such as sulfamic acid, cyclohexylsulfamic acid, etc.; and aminophosphonic acids such as 1-aminomethylphosphonic acid, 1-dimethylaminoethylphosphonic acid, 2-aminoethylphosphonic acid, 2-aminopropylphosphonic acid , 4-aminophenylphosphonic acid, 1-aminoethane-1,1-diphosphonic acid, 1-amino-1-phenylmethane-1,1-diphosphonic acid, 1-dimethylaminoethane-1,1-diphosphonic acid, 1-dimethylaminobutane-1,1-diphosphonic acid, ethylenediamine-tetramethylenephosphonic acid, etc.

Also, the salts of hydrochloric acid, sulfuric acid, nitric acid, a sulfonic acid (methanesulfonic acid, etc.), or oxalic acid and an alkali metal, ammonia, a lower alkanolamine (triethanolamine, etc.), a lower alkylamine (triethylamine, etc.), etc., can be suitably used.

Furthermore, water-soluble polymers such as polyacrylamide, polyvinyl alcohol, polyvinyl pyrrolidine, polyethyleneimine and the mineral acid salts of thereof, poly(meth)acrylic acid and the metal salts thereof, polystyrenesulfonic acid and the metal salts thereof, (meth)acrylic acid alkyl esters and 2-acrylamide-2-methyl-1-propanesulfonic acid and the metal salts of them, the polymer of chlorotrialkylammonium methylstyrene and the copolymer thereof and (meth)acrylic acid, polyvinylphosphonic acid, etc., can be also suitably used.

Moreover, soluble starch, carboxymethyl cellulose, dextrin, hydroxyethyl cellulose, gum arabic, guar gum, sodium alginate, gelatin, glucose, sorbitol, etc., can be suitably used. These compounds may be used singly or as a combination of two or more kinds thereof.

In the case of the treatment, it is preferred that the above-described compound is dissolved in water and/or methanol at a concentration of from 0.001 to 10% by weight, and particularly from 0.01 to 1.0% by weight and as the treatment conditions, the support is immersed at a temperature range of from 25 to 95° C., preferably from 50 to 95° C., a pH of from 1 to 13, preferably from 2 to 10, and for from 10 seconds to 20 minutes, preferably from 10 seconds to 3 minutes.

In the case of using as a subbing layer for coating the photosensitive layer, the compound is similarly dissolved in water and/or methanol at a concentration of from 0.001 to 10% by weight, and particularly from 0.01 to 1.0% by weight, and if necessary, the pH of the solution is controlled with a basic substance such as ammonia, triethylamine, potassium hydroxide, etc., or an acidic substance such as hydrochloric acid, phosphoric acid, etc., and the solution can be used at a pH range of from 1 to 12. Also, for improving the tone reproducibility of the photosensitive lithographic printing plate, a yellow-base dye can be added. The dry coated amount of the organic subbing layer is suitably from 2 to 200 mg/m$^2$, and preferably from 5 to 100 mg/m$^2$. When the coated amount is less than 2 mg/M$^2$, a sufficient effect is not obtained for the essential purpose of the stain prevention, etc. Also, when the coated amount exceeds 200 mg/M$^2$, the printing durability is lowered.

In addition, to increase the adhesion of the support and the photosensitive layer, an interlayer may be formed. For improving the adhesion, the interlayer is generally made of a diazo resin or a phosphoric acid compound adhering to, for example, aluminum. The thickness of the interlayer is optional but must be a thickness capable of carrying out a uniform bond-forming reaction with the upper photosensitive layer at the exposure. Usually, the coated ratio is preferably from about 1 to 100 mg/m$^2$, and particularly preferably from 5 to 40 mg/m$^2$ as dry components. The using ratio of the diazo resin in the interlayer is from 30 to 100%, and preferably from 60 to 100%.

Before applying the above-described treatment and the subbing layer, the anodized support can be subjected to the following treatments after being subjected to a water washing treatment for the purposes of restraining the dissolution of the anodized film in a developer, restraining the formation of residual films of the components of the photosensitive layer, the improvement of the strength of the anodized film, the improvement of the hydrophilic property of the anodized film, the improvement of the adhesion with the photosensitive layer.

As one of the treatments, there is a silicate treatment of treating the anodized film by contacting an aqueous solution of a silicate of an alkali metal. In this case, the concentration of the alkali metal silicate is from 0.1 to 30% by weight, and preferably from 0.5 to 15% by weight, and the anodized film is contacted with the aqueous silicate solution the pH of which at 25° C. is from 10 to 13.5, at a temperature of from 5 to 80° C., preferably from 10 to 70° C., and more preferably from 15 to 50° C. for from 0.5 to 120 seconds. As a contact method, any method such as dipping, spraying, etc., can be employed. When the pH of the aqueous solution of the alkali metal silicate is lower than 10, the liquid is gelled, while when the pH is higher than 13.5, the anodized film is dissolved.

As the alkali metal silicate used in the invention, sodium silicate, potassium silicate, lithium silicate, etc., is used. As the hydroxide used for controlling the pH of the aqueous solution of the alkali metal silicate, there are sodium hydroxide, potassium hydroxide, lithium hydroxide, etc. In addition, to the above-described treatment liquid, an alkaline earth metal salt or a salt of a metal of group IVB may be added. The alkaline earth metal salts include nitrates such as calcium nitrate, strontium nitrate, magnesium nitrate, barium nitrate, etc., and the water-soluble salts such as the sulfates, the hydrochlorides, the phosphates, the acetates, the oxalates, the borates, etc. The salts of the metal of group IVB include titanium tetrachloride, titanium trichloride, potassium titanium fluoride, potassium titanium oxalate, titanium sulfate, titanium tetraiodide, zirconium chlorooxide, etc. The alkaline earth metal salts or the salts of the metal of group IVB can be used singly or a combination of them. The concentration of the metal salt(s) is in the range of preferably from 0.01 to 10% by weight, and more preferably from 0.05 to 5.0% by weight.

As other treatment, there are various kinds of sealing treatments and steam sealing, boiling water (hot water) sealing, metal salt sealing (chromate/dichromate sealing, nickel acetate sealing, etc.), fat-impregnation sealing, synthetic resin sealing, low-temperature sealing (with potassium ferricyanate or an alkaline earth metal salt), etc., which are generally known as a sealing treatment method for an anodized film, can be used but from the view points of the performance as a support for printing plate (adhesion with a photosensitive layer and the hydrophilic property), a high-speed treatment, a low cost, a low pollution, etc., steam sealing is relatively preferred. As the method, for example, there is a method of contacting pressed or normal-pressure steam with the anodized film continuously or non-continuously at a relative humidity of at least 70%, a steam temperature of at least 95° C. for from about 2 seconds to 180 seconds disclosed in Japanese Patent Application Laid-Open (JP-A) No. 4-176690. As other sealing treatment method, a method of immersing the support in hot water or an alkali aqueous solution having a temperature of from about 80 to 100° C. or spraying the hot water of the alkali aqueous solution onto the support and in place of or in succession to the above-described treatment, a method of immersing the support in an aqueous solution of a nitrite or spraying the solution onto the support can be used. Examples of the nitrite include the nitrites of the metals of groups Ia, IIa, IIb, IIIb, IVb, IVa, VIa, VIIa, and VIII or the ammonium, that is, ammonium nitrite. As practical examples of the metal salts, $LiNO_2$, $NaNO_2$, $KNO_2$, $Mg(NO_2)_2$, $Ca(NO_2)_2$, $Zn(NO_2)_2$, $Al(NO_2)_3$, $Zr(NO_2)_4$. $Sn(NO_2)_3$, $Cr(NO_2)_3$, $Co(NO_2)_2$, $Mn(NO_2)_2$, and $Ni(NO_2)_2$ are preferred, and the alkali metal nitrites are particularly preferred. The nitrites can be used as a mixture of two or more kinds of them.

The treatment conditions differ according to the state of the support and the kind of the alkali metal and thus are not specifically determined but in the case of using, for example, sodium nitrite, the concentration is generally from 0.001 to 10% by weight, and preferably from 0.01 to 2% by weight, the bath temperature is generally from room temperature to about 100° C., and preferably from 60 to 90° C. and the treatment time is generally from 15 seconds to 300 seconds, and preferably from 10 seconds to 180 seconds. The pH of the aqueous nitrite solution is preferably from 8.0 to 11.0, and particularly preferably from 8.5 to 9.5. For controlling the pH of the aqueous nitrite solution, the pH can be suitably controlled using, for example, an alkali buffer solution, etc. There is no particular restriction on the alkali buffer solution but, for example, an aqueous solution of a mixture of sodium hydrogencarbonate and sodium hydroxide, an aqueous solution of a mixture of a sodium carbonate and sodium hydroxide, an aqueous solution of a mixture of sodium carbonate and sodium hydrogencarbonate, an aqueous solution of a mixture of sodium chloride and sodium hydroxide, an aqueous solution of a mixture of hydrochloric acid and sodium carbonate, and an aqueous solution of a mixture of sodium tetraborate and sodium hydroxide can be suitably used. Also, in the above-described alkali buffer solution, other alkali metal salt than sodium salt, for example, a potassium salt can be used.

After applying the silicate treatment or the sealing treatment described above, the acidic aqueous solution treatment and hydrophilic subbing disclosed in Japanese Patent Application Laid-Open (JP-A) No. 5-278362 may be carried out or the organic layer disclosed in Japanese Patent Application Laid-Open (JP-A) Nos. 4-282637 and 7-314937 may be formed thereon for improving the adhesion with the photo sensitive layer.

After applying the treatments as described above or applying subbing, etc., on the surface of the support, if necessary, a backcoat is formed on the back surface of the support. As such a backcoat, the coated layer of the organic high molecular weight compound described in Japanese Patent Application Laid-Open (JP-A) No. 5-45885 and the coated layer made of a metal oxide obtained by hydrolyzing and polycondensing the organic or inorganic metal compound described in Japanese Patent Application Laid-Open (JP-A) No. 6-35174 are preferably used. In these coated layers, the alkoxy compound of silicon such as $Si(OCH_3)_4$, $Si(OC_2H_5)_4$, $Si(OC_3H_7)_4$, $Si(OC_4H_9)_4$, etc., are particularly preferred since they are inexpensive and easily available, and also the coated layers of the metal oxides obtained therefrom are excellent in the developer resistance.

As the preferred characteristics as the support for a lithographic printing plate, the center-line average roughness is from 0.10 to 1.2 $\mu$m. When the roughness is lower than 0.10 $\mu$m, the adhesion with the photosensitive layer is lowered and the printing durability is greatly lowered. On the other hand, the roughness is larger than 1.2 $\mu$m, staining property become remarkable at printing. Furthermore, a the color density of the support, the reflection density value is from 0.15 to 0.65. When the color density is more white than 0.15, the halation at image exposure is too intense to hinder the image formation, and when the color density is more black than 0.65, images are hard to see in the plate inspection work after development and the plate inspection property is greatly inferior.

As described above, the lithographic printing plate precursor (or master plate) using the image recording material of the invention can be prepared. The lithographic printing plate precursor can be recorded by an infrared laser. Also, thermal recording by a ultraviolet lamp or a thermal head is possible. In the present invention, it is preferred to be image exposed by a solid laser or a semiconductor laser emitting infrared rays having wavelengths of from 760 nm to 1200 nm. The output of the laser is preferably at least 100 mW and to shorten the exposure time, it is preferred to use a multi beam laser device. Also, it is preferable that the exposure time per one pixel is within 20$\mu$ seconds. It is preferred that the energy irradiated to the recording material is from 10 to 300 mJ/cm$^2$.

After exposed by an infrared laser, the image recording material of the invention is preferably developed with water or an alkaline aqueous solution.

When an alkaline aqueous solution is used as a developer, as the developer and the replenishing liquid for the image recording material of the invention, known alkali aqueous solutions can be used. Examples of the alkali used for the alkali solution include inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, lithium hydroxide, etc.; and also organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, etc.

These alkali agents may be used singly or a combination of two or more kinds thereof.

Furthermore, in the case of developing using an automatic developing machine, it is known that by adding the same solution as the developer or an aqueous solution (replenishing liquid) having a higher alkali strength than the developer to the developer, a large amount of lithographic printing precursors (or master plates) can be processed for without exchanging the developer in the developing tank for along time. In the invention, this replenishing system is preferably applied.

To the developer and the replenisher, if necessary, various surface active agents, organic solvents, etc., can be added for the purposes of accelerating or restraining the developing property, dispersing development scum, and increasing the ink adaptability of the image portions of the printing plate. As preferred surface active agents, there are anionic surface active agents, cationic surface active agents, nonionic surface active agents, and amphoteric surface active agents. Also, as the preferred organic solvent, there are benzyl alcohol, etc. Also, the addition of polyethylene glycol or the derivatives thereof or polypropylene glycol or the derivatives thereof is preferred. Also, a nonreducing sugar such as arabitol, sorbitol, mannitol, etc., can be added.

Furthermore, if necessary, to the developer and the replenisher may be further added an inorganic salt-base reducing agent such as hydroquinone, resorcinol, the sodium salt or the potassium salt of sulfurous acid or hydrogensulfurous acid, as well as an organic carboxylic acid, a defoaming agent and a water softener.

As such a developer containing the surface active agent, the organic solvent, and a reducing agent, for example, there are the developer composition made of benzyl alcohol, an anionic surface active agent, an alkali agent, and water described in Japanese Patent Application Laid-Open (JP-A) No. 51-77401, the developer composition made of an aqueous solution containing benzyl alcohol, an anionic surface active agent, and a water-soluble sulfite described in Japanese Patent Application Laid-Open (JP-A) No. 53-44202, and the developer composition containing an organic solvent having a solubility to water of not higher than 10% by weight at normal temperature, an alkali agent, and water described in Japanese Patent Application Laid-Open (JP-A) No. 55-155355, and these compositions are suitably used in the invention.

The printing plate developed using the above-described developer and replenisher is subjected to post treatment with washing water, a rinse liquid containing a surface active agent, etc., and a desensitizing liquid containing a gum arabic or a starch derivative. As the post treatment in the case of using the image recording material of the invention as a lithographic printing plate, these treatments are used by variously combining them.

In recent year, automatic developing machines for processing printing precursors have been widely used in the plate-making and printing industries for rationalizing and standardizing the plate-making work. The automatic developing machine, which is generally composed of a developing section and a pose-treatment section, includes a device for transporting printing plate precursors, each processing tank, and a spray device, wherein while transporting a exposed printing plate precursor in the horizontal direction, the printing plate precursor is developed by spraying from spray nozzles each processing liquid supplied by a pump. Also, recently, a method of processing the exposed printing plate precursor by transporting it through a processing liquid in a processing tank filled with the processing liquid by guide rolls disposed in the liquid is known. In such automatic processing, the printing plate precursors can be processed while replenishing the replenisher to each processing liquid according to the processed amount and the operated time. Also, by perceiving the electric conductivity by a sensor, the replenisher can be automatically replenished. Also, a so-called disposal processing system of processing with a substantially non-used processing liquid can be applied. The burning treatment is applied to the lithographic printing plate for obtaining the plate having higher printing durability.

The lithographic printing plate thus obtained can be, if desired, after being coated with a desensitizing gum, supplied to a printing step.

When the lithographic printing plate is subjected to a burning treatment, it is preferred to treat the lithographic printing plate with the counter-etching solution as described in Japanese Patent Application Publication (JP-B) Nos. 61-2518 and 55-28062, Japanese Patent Application Laid-Open (JP-A) Nos. 62-31859 and 61-159655 before applying burning.

As the method of treating the counter-etching solution, a method of coating the counter-etching solution on the lithographic printing plate by a sponge or a absorbent cotton impregnated with the solution, a method of dipping the printing plate in a vat filled with the counter-etching solution, or a method of coating the solution on the lithographic printing plate by an automatic coater is applied. Also, after coating, when the coated amount is made even by squeegee or a squeegee roller, more preferred result is obtained.

The coating amount of the counter-etching solution is generally from 0.03 to 0.8 $g/m^2$ by dry weight.

The lithographic printing plate coated with the counter-etching solution is, if necessary, after being dried, heated to a high temperature by a burning processor (e.g., Burning Processor, BP-1300, trade name, manufactured by Fuji Photo Film Co., Ltd.). The heating temperature and time in this case are preferably in the range of from 180 to 300° C., for from 1 to 20 minutes, although they differ according to the kinds of the components forming images.

The lithographic printing plate subjected to the burning treatment can be, if necessary, subjected to treatments, which have hitherto been carried out, such as water washing, application of gum, etc., but when the counter-etching solution containing a water-soluble high molecular compound, etc., is used a so-called desensitizing treatment such the application of gum, etc., can be omitted.

The lithographic printing plate obtained by such treatments is mounted on an offset printing machine and used for printing a large number of prints.

Then, the present invention is practically described by the examples but the invention is not limited to these examples.

EXAMPLES 1 TO 6

[Preparation of support]

A melt of the alloy of JIS A1050 containing at least 99.5% aluminum, 0.30% Fe, 0.10% Si, 0.02% Ti, and 0.013% Cu was subjected to a cleaning treatment and cast. In the cleaning treatment, to remove unnecessary gases such as hydrogen in the melt, the melt was subjected to a degassing treatment and subjected to a ceramic tube filter treatment. Casting was carried out by a DC casting method. After cutting off surface of 10 mm in thickness from the solidified ingot having a thickness of 500 mm, the ingot was subjected to a homogenizing treatment at 550° C. for 10 hours so that the intermetallic compound did not become coarse. Then, the ingot was hot rolled at 400° C., and after process annealing it in a continuous annealing furnace at 500° C. for 60 seconds, the annealed product was cold rolled to provide an aluminum rolled plate having a thickness of 0.30 mm. By controlling the roughness of the rolling roll, the center-line average surface roughness (Ra) of the plate after cold rolling was controlled to 0.2 μm. Thereafter, to improve the flatness, the aluminum plate was subjected to a tension leveler.

Then, surface treatments for making a lithographic printing plate support were carried out.

First, for removing the rolling oil on the surface of the aluminum plate, a degreasing treatment was carried out by an aqueous solution of 10% sodium aluminate at 50° C. for 30 seconds and then a neutralization and desmutting treatment was carried out by an aqueous solution of 30% sulfuric acid at 50° C. for 30 seconds.

Then to improve the adhesion of the support and a photosensitive layer and to give a water retention to non-image portions, a so-called graining treatment of roughening the surface of the support was applied. An aqueous solution containing 1% nitric acid and 0.5% aluminum nitrate was kept at 45° C., while passing the aluminum web through the aqueous solution, by giving an anodic electric quantity of 240 C/dm$^2$ of an alternating waveform of a duty ratio of 1:1 at a current density of 20 A/dm$^2$ from an indirect power supplying cell, electrolytic graining was carried out. Thereafter, an etching treatment was carried out with an aqueous solution of 10% sodium aluminate at 50° C. for 30 seconds and then a neutralization and desmutting treatment was carried out with an aqueous solution of 30% sulfuric acid at 50° C. for 30 seconds.

Furthermore, to improve the abrasion resistance, the chemical resistance and the water retention, by anodizing, an anodized film was formed on the support. That is, using an aqueous solution of 20% sulfuric acid as the electrolyte at 35° C., while passing the aluminum web through the electrolyte, by carrying out an electrolytic treatment by a direct current of 14 A/dm$^2$ by an indirect power supplying cell, an anodized film of 2.5 g/m$^2$ was formed.

Thereafter, to ensure the water retention as non-image portions of printing plate, silicate treatment was carried out. In the treatment, the aluminum web was passed through an aqueous solution of 1.5% 3# sodium silicate kept at 70° C. such that the contact time of the aluminum web became 15 seconds and further the web was washed with water. The attached amount of Si was 10 mg/m$^2$. The center-line surface roughness (Ra) of the support thus prepared was 0.25 μm.

[Subbing]

Then, the aluminum support was coated with the subbing solution described below by a wire bar and dried using a warm blast type drying apparatus at 90° C. for 30 seconds. The coated amount after drying was 10 mg/m$^2$.

[Subbing solution]
Copolymer of ethyl methacrylate and sodium 2-acrylamide-2-methyl-1-propanesulfonate at 75:15

| | |
|---|---|
| by mol ratio | 0.1 g |
| 2-Aminoethylphosphonic acid | 0.1 g |
| Methanol | 50 g |
| Ion-exchanged water | 50 g |

[Photosensitive layer]

Then, solution [P] described below was prepared, immediately after preparing, the solution was coated on the above-described subbed aluminum plates using a wire bar, and dried by a warm-blast type drying apparatus at 115° C. for 45 seconds to obtain negative-type lithographic printing plate precursors [P1-1] to [P6-1]. Furthermore, after storing the same solution [P] for 3 days at 30° C., the solution was similarly coated on the aluminum plates and dried to obtain negative-type lithographic printing plate precursors [P1-3] to [P6-3]. The coated amount after drying was 1.3 g/m$^2$. The infrared absorbents and the onium salts used in the case are shown in Table 1 below. In addition, when the reflection density of each of the photosensitive layers of these lithographic printing plate precursors at the absorption maximum in the infrared region was measured, they were in the range of from 0.6 to 1.2.

<Solution [P]>

| | |
|---|---|
| Infrared absorbent (compound shown in Table 1) | 0.10 g |
| Onium salt (compound shown in Table 1) | 0.30 g |
| Dipentaerythritol hexaacrylate | 1.00 g |
| Copolymer of allyl methacrylate and methacrylic acid at 80:20 by mol ratio (weight average molecular weight 120,000) | 1.00 g |
| Naphthalenesulfonate of Victoria Pure Blue | 0.04 g |
| Fluorine-base surface active agent (Megafac F-176, manufactured by DAINIPPON INK & CHEMICALS, INC.) | 0.01 g |
| Methyl ethyl ketone | 9.0 g |
| Methanol | 10.0 g |
| 1-Methoxy-2-propanol | 8.0 g |

TABLE 1

| | Lithographic Printing Plate | Infrared absorbent | Onium salt |
|---|---|---|---|
| Example 1 | [P1-1], [P1-3] | [IR-1] | [OI-2] |
| Example 2 | [P2-1], [P2-3] | [IR-1] | [ON-2] |
| Example 3 | [P3-1], [P3-3] | [IR-1] | [OS-2] |
| Example 4 | [P4-1], [P4-3] | [IR-6] | [ON-5] |
| Example 5 | [P5-1], [P5-3] | [IR-6] | [OI-7] |
| Example 6 | [P6-1], [P6-3] | [IR-1] | [OI-2] and [ON-2] each at 0.15g |
| C. Example 1 | [Q1-1], [Q1-3] | [NK-2014] | [OI-2] |
| C. Example 2 | [Q2-1], [Q2-3] | [NK-2014] | [ON-2] |
| C. Example 3 | [Q3-1], [Q3-3] | [NK-2014] | [OS-2] |

C. Example: Comparative Example

[Light exposure]

Each of the negative-type lithographic printing plate precursors [P1-1] to [P6-1] and [P1-3] to [P6-3] was image-exposed by Trendsetter 3244 VFS manufactured by Creo Co., Ltd. mounted a water-cooling type 40 W infrared semiconductor laser under the conditions of an output of 9 W, an outer face drum rotation number of 210 rpm., a plate surface energy of 100 mJ/cm$^2$, and a resolution of 2400 dpi.

[Development treatment]

After exposure, each sample was exposed using an automatic developing machine, Stablon 900N, manufactured by Fuji Photo Film Co., Ltd. As the developer, a 1:1 water-diluted solution of DN-3C, manufactured by Fuji Photo Film Co., Ltd. was used as both the stock solution and the replenisher. The temperature in the developing bath was 30° C. Also, as a finisher, a 1:1 water-diluted solution of FN-6, manufactured by Fuji Photo Film Co., Ltd. was used.

[Evaluation of stain at printing]

Each of the lithographic printing plate [P1-1] to [P6-1] and [P6-3] to [P6-3] obtained as described above was used for printing by a printing machine, Heidel SOR-M, manufactured by Heidelberg Co., Ltd., using a commercially available oily ink. In this case, the state of the formation of stains at the non-image portions was visually evaluated. The results are shown in Table 2. No stain was observed in each of the lithographic printing plates.

[Number of prints]

Then, Each of the lithographic printing plate [P1-1] to [P6-1] and [P1-3] to [P6-3] was used for printing using a printing machine, Lithlon, manufactured by Komori Corporation. In this case, the number of the prints which could be printed with a sufficient ink density was visually evaluated. The results are shown in Table 2.

Comparative Examples 1 to 3

In place of the solution [P] used in Examples 1 to 3, a solution was prepared using an infrared absorbent NK-2014 having the structure shown below, manufactured by Nippon Kankosikiso Kenkyusho K.K. in place of the infrared absorbent in the present invention. As in the cases of Examples 1 to 3, directly after preparing the solution, the solution was coated on the aluminum supports and dried to obtain lithographic printing plate precursors [Q1-1] to [Q3-1], and after storing the same solution for 3 days at 30° C., the solution was coated on the supports and dried to obtain lithographic printing plate precursors [Q1-3] to [Q3-3]. Details such as the onium salts used, etc., were shown in above Table 1 together.

[NK-2014]

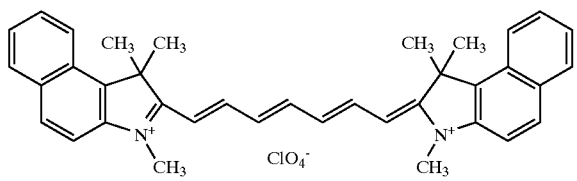

Each of the lithographic printing plate precursors [Q1-1] to [Q3-1] and [Q1-3] to [Q3-3] obtained was exposed and developed as Examples 1 to 6 to obtain lithographic printing plates [Q1-1] to [Q3-1] and [Q1-3] to [Q3-3]. Furthermore, printing was practiced as in Examples 1 to 6, the states of the formation of stains at the non-image portions were visually evaluated. The results are shown in Table 2 below.

TABLE 2

|  | Lithographic printing plate | Stain formed at non-image portions | Number of prints |
| --- | --- | --- | --- |
| Example 1 | [P1-1] | not formed | 50,000 |
|  | [P1-3] | not formed | 50,000 |
| Example 2 | [P2-1] | not formed | 45,000 |
|  | [P2-3] | not formed | 44,000 |
| Example 3 | [P3-1] | not formed | 41,000 |
|  | [P3-3] | not formed | 41,000 |
| Example 4 | [P4-1] | not formed | 47,000 |
|  | [P4-3] | not formed | 46,000 |
| Example 5 | [P5-1] | not formed | 51,000 |
|  | [P5-3] | not formed | 51,000 |
| Example 6 | [P6-1] | not formed | 42,000 |
|  | [P6-3] | not formed | 42,000 |
| C. Example 1 | [Q1-1] | not formed | 20,000 |
|  | [Q1-3] | formed | 10,000 |
| C. Example 2 | [Q2-1] | not formed | 18,000 |
|  | [Q2-3] | formed | 8,000 |
| C. Example 3 | [Q3-1] | not formed | 17,000 |
|  | [Q3-3] | formed | 6,000 |

C. Example: Comparative Example

As is clear from Table 2, in the lithographic printing plates of the invention using the cyanine dyes having the specific structures as the infrared absorbents, in both the case that the coating liquid for recording layer was coated immediately after preparing the liquid and the case that the coating liquid was coated after storing, in spite of developing and printing without carrying out a heat treatment after image formation by image exposure, stains were not formed at the non-image portions and also a large number of prints could be obtained. On the other hand, in regard to the comparative examples using other infrared absorbent outside the scope of the present invention, in the lithographic printing plates [Q1-1] to [Q3-1] obtained by coating and drying the coating liquid for recording layer immediately after preparation of the liquid, stains were not observed at the non-image portions, but in the lithographic printing plates [Q1-3] to [Q3-3] obtained by coating and drying the same liquid after storing for 3 days at 30° C., stains were formed at the non-image portions. Also, in the lithographic printing plates [Q1-1] to [Q3-1], there was a tendency that the number of prints obtained was less than the cases of the examples, and further, in the lithographic printing plates [Q1-3] to [Q3-3] used the coating liquid for recording layer after stored, the number of the prints was largely reduced.

EXAMPLES 7 AND 8

Solution [R] described below was prepared and immediately after preparing, the solution was coated on each of the subbed aluminum supports prepared in Examples 1 to 6 using a wire bar and dried by a warm blast type drying apparatus at 115° C. for 45 seconds to obtain negative-type lithographic printing plate precursors [R1-1] and [R2-1]. Furthermore, after the same solution was stored for 3 days at 30° C., the solution was coated and dried by the same way as above to obtain negative-type lithographic printing plate precursors [R1-3] and [R2-3]. The coated amount after drying was 1.3 g/m$^2$. The infrared absorbents and the onium salts used in the case are shown in Table 3 below. When the reflection density of each of the photosensitive layers of these lithographic printing plate precursors at the absorption maximum in the infrared region was measured, there were in the range of from 0.6 to 1.2.

<Solution [R]>

| Infrared absorbent (compound shown in Table 3) | 0.10 g |
| --- | --- |
| Onium salt (compound shown in Table 3) | 0.30 g |
| multifunctional monomer having structure described below | 1.00 g |
| Addition polymer of 4,4'-diphenylmethane diisocyanate, hexamethylene diisocyanate, tetraethylene glycol and 2,2-bis(hydroxymethyl)propionic acid at 30:20:30:2 by mol ratio (weight average molecular weight 60,000) | 1.00 g |
| Naphthalenesulfonate of Victoria Blue | 0.04 g |
| Fluorine-base surface active agent (Megafac F-176, manufactured by DAINIPPON INK & CHEMICALS, INC.) | 0.01 g |
| Methyl ethyl ketone | 5.0 g |
| Methanol | 10.0 g |
| 1-Methoxy-2-propanol | 8.0 g |
| Methyl lactate | 2.0 g |
| γ-Butyrolactone | 2.0 g |

Structural formula of the monomer

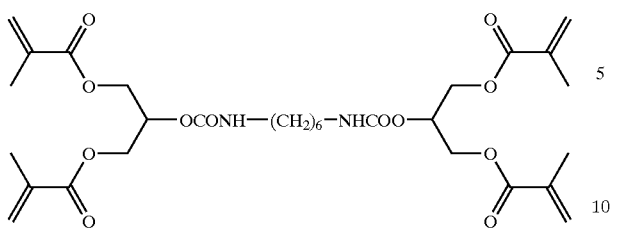

TABLE 3

|  | Lithographic printing plate | Infrared absorbent | Onium salt |
| --- | --- | --- | --- |
| Example 7 | [R1-1], [R1-3] | [IR-11] | [O1-1] |
| Example 8 | [R2-1], [R2-3] | [IR-1] and [IR-11] each 0.05 g | [ON-5] |
| C. Example 4 | [S1-1], [S1-3] | [NK-327] | [O1-1] |

C. Example: Comparative Example

[Light exposure]

Each of the negative-type lithographic printing plate precursors [R1-1], [R2-1] and [R1-3], [R2-3] was image-exposed by Luxel T-9000CTP (manufactured by Fuji Photo Film Co., Ltd.) mounted a multi-channel laser heads under the conditions of the output per one beam of 250 mW, an outer face drum rotation number of 800 rpm., and a resolution of 2400 dpi.

After the exposure, the development treatment was carried out as in Example 1 to 6 to obtain lithographic printing plates [R1-1], [R2-1] and [R1-3], [R2-3]. About the lithographic printing plates [R1-1], [R2-1] and [R1-3], [R2-3] obtained, the evaluation of stains at printing and the evaluation of the number of prints were carried out as in Examples 1 to 6. The results are shown in Table 4 below.

Comparative Example 4

In place of the solution [R] used in Examples 7 and 8, a solution was prepared using an infrared absorbent NK-427 having the structure shown below, manufactured by Nippon Kankoshikiso Kenkyusho K.K. in place of the infrared absorbent in the present invention. As in the cases of Examples 1 to 3, directly after preparing the solution, the solution was coated on the aluminum supports and dried to obtain lithographic printing plate precursor [S1-1], and after storing the same solution for 3 days at 30° C., the solution was coated on the supports and dried to obtain lithographic printing plate precursors [S1-3]. Details such as the onium salts used, etc., were shown in above Table 3 together.

[NK-427]

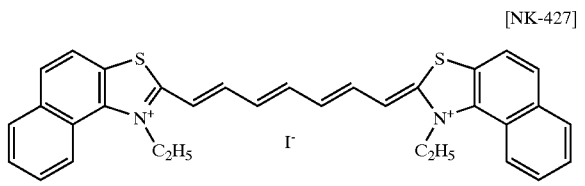

Each of the lithographic printing plate precursors [S1-1] and [S1-3] was exposed and developed as in Examples 7 and 8 to obtain lithographic printing plates [S1-1] and [S1-3]. Furthermore, printing was carried out using each of the lithographic printing plate [S1-1] and [S1-3] as in Examples 7 and 8, and the states of the formation of stains at the non-image portions were visually observed. The results are shown in Table below.

TABLE 4

|  | Lithographic printing plate | Stains formed at non-image portions | Number of prints |
| --- | --- | --- | --- |
| Example 7 | [R1-1] | not formed | 42,000 |
|  | [R1-3] | not formed | 41,000 |
| Example 8 | [R2-1] | not formed | 40,000 |
|  | [R2-3] | not formed | 40,000 |
| C. Example 4 | [S1-1] | not formed | 19,000 |
|  | [S1-3] | formed | 6,000 |

C. Example: Comparative Example

As is clear from Table 4, in each of the lithographic printing plates [R1-1], [R2-1] and [R1-3], [R2-3] obtained in the examples of the invention, no stain was formed at the non-image portions and a large number of prints were obtained.

On the other hand, in the comparative examples using infrared absorbents outside the scope of the invention, in the lithographic printing plates [S1-1] obtained by coating and drying the coating liquid for recording layer immediately after preparation of the liquid, stains were not observed, but in the lithographic printing plates [S1-3] obtained by coating and drying the same liquid after storing for 3 days at 30° C., stains were formed at the non-image portions. Also, in the lithographic printing plates [S1-1], the number of the prints was less as compared with Example 7 obtained under the same condition except that the infrared absorbent used was different, and further in the lithographic printing plates [S1-3] using the coating liquid after storing, the number of the prints was greatly reduced.

According to the present invention, by recording using a solid laser or a semiconductor laser emitting infrared rays, direct recording from digital data from a computer, etc., is possible and when the invention is used as a lithographic printing plate, a negative-type image recording material obtaining many good prints without carrying out heat treatment at the image formation can be provided. Furthermore, a negative-type image recording material, wherein the coating liquid for the recording layer is excellent in the storage stability and can be stored for a long period of time, can be provided.

EXAMPLES 9 TO 12

[Preparation of support]

The supports were prepared by the same ways as in Examples 1 to 6.

[Subbing]

Subbing was carried out as in Examples 1 to 6.

[Photosensitive layer]

Then, solution [P] described below was prepared, the solution was coated on each of the above-described subbed aluminum plates using a wire bar and dried by a warm blast type drying apparatus at 115° C. for 45 seconds to obtain negative-type lithographic printing plate precursors [P-1] to [P-4]. The coated amount after drying was in the range of from 1.2 to 1.3 g/m$^2$. The amounts of the infrared absorbent and the kinds of onium salts used in the case are shown in Table 5 below.

<Solution [P]>
Infrared absorbent [IR-6] [the amounts shown in Tables 5 and 7]

| | |
|---|---|
| Onium salt (compound shown in Tables 1 and 3) | 0.30 g |
| Dipentaerythritol hexaacrylate | 1.00 g |
| Copolymer of allyl methacrylate and methacrylic acid at 80:20 by mol (weight average molecular weight 120,000) | 1.00 g |
| Naphthalenesulfonate of Victoria Pure Blue | 0.04 g |
| Fluorine-base surface active agent (Megafac F-176, manufactured by DAINIPPON INK & CHEMICALS, INC.) | 0.01 g |
| Methyl ethyl ketone | 9.0 g |
| Methanol | 10.0 g |
| 1-Methoxy-2-propanol | 8.0 g |

TABLE 5

| | Lithographic printing plate precursor | Amount of infrared absorbent | Onium salt | Absorbance |
|---|---|---|---|---|
| Example 9 | [P-1] | 0.08 g | [OI-6] | 0.97 |
| Example 10 | [P-2] | 0.15 g | [OI-6] | 1.12 |
| Example 11 | [P-3] | 0.08 g | [ON-2] | 0.97 |
| Example 12 | [P-4] | 0.08 g | [ON-5] and [OS-1] each 0.15 g | 0.97 |

[Measurement of absorbance]

The absorbance of each of the negative-type lithographic printing plate precursors [P-1] to [P-4] obtained was measured by Hitachi Self-Recording Spectrophotometer, U-3000 manufactured by Hitachi, Ltd. The measurement was carried out by a reflection method using an integrating sphere and a support without being coated with a subbing layer and a photosensitive layer was used as a reference. The maximum absorption in the wavelengths of from 760 nm to 1200 nm was about 810 nm. the absorbances in these wavelengths are shown in Table 5. They were in the range of 0.5 to 1.2.

[Light exposure]
The exposure was carried out as in Examples 1 to 6.
[Development treatment]
The treatment was carried out as in Examples 2 to 6.
[Printing]
Then, each of the lithographic printing plates [P-1] to [P-4] is used for printing using a printing machine, Lithlon manufactured by Komori Corporation. In this case, the number of the prints which could be printed with a sufficient ink density was visually evaluated. The results are shown in Table 6.

TABLE 6

| | Lithographic printing plate | Number of prints |
|---|---|---|
| Example 9 | [P-1] | 48,000 |
| Example 10 | [P-2] | 45,000 |
| Example 11 | [p-3] | 46,000 |
| Example 12 | [P-4] | 44,000 |

As clear from Table 6, it can be seen that the lithographic printing plates obtained by the examples of the invention can print a large number of prints and are excellent in the printing durability.

Comparative Examples 9 to 12

By following the same procedures as Examples 9 to 12 except the addition amount of the infrared absorbent [IR-6] was changed as described in Table 7 in the solution [P] used in Examples 9 to 12, the lithographic printing plate precursors [P-5] to [P-9] were obtained. The coated amount of the photosensitive layer after drying was in the range of from 1.2 to 1.3 g/m². The amount of the infrared absorbent and the kinds of the onium salts used in the cases are shown in Table 7. Also, the absorbance of each photosensitive layer was measured as in Examples 9 to 12, The results are shown in Table 7 and were outside of the range of 0.5 to 1.2 of the invention.

TABLE 7

| | Lithographic printing plate precursor | Amount of infrared absorbent | Onium salt | Absorbance |
|---|---|---|---|---|
| C. Example 9 | [P-5] | 0.30 g | [OI-6] | 1.25 |
| C. Example 10 | [P-6] | 0.02 g | [OI-6] | 0.30 |
| C. Example 11 | [P-7] | 0.30 g | [ON-2] | 1.25 |
| C. Example 12 | [P-8] | 0.30 g | [ON-5] and [OS-1] each 0.15 g | 1.25 |

C. Example: Comparative Example

Each of the lithographic printing plate precursors [P-5] to [P-8] obtained was exposed and developed as in Examples 9 to 12 to obtain lithographic printing plates [P-5] to [P-8]. Furthermore, printing was carried out as in Examples 9 to 12, the number of the prints printed with a sufficient ink density was visually evaluated. The results are shown in Table 8 below.

TABLE 8

| | Lithographic printing plate | Number of prints |
|---|---|---|
| C. Example 9 | [P-5] | 25,000 |
| C. Example 10 | [P-6] | 14,000 |
| C. Example 11 | [P-7] | 22,000 |
| C. Example 12 | [P-8] | 18,000 |

C. Example: Comparative Example

As is clear from Table 8, it can be seen that in the lithographic printing plates of the comparative examples, wherein the absorbance of the photosensitive layer becomes outside the range of the invention by controlling the addition amount of the infrared absorbent, in the cases that the absorbance was too high and too low, the number of the prints was reduced as compared with the lithographic printing plates of the examples of the invention using the same onium salt.

What is claimed is:

1. A negative-type image recording material for recording images thereon, by irradiation with infrared light, the image recording material comprising: (a) an infrared absorbent; (b) a sulfonium salt; (c) a radical polymerizing compound; and (d) a binder polymer.

2. The negative-type image recording material according to claim 1, wherein the infrared absorbent includes at least one cyanine dye having a partial structure represented by a formula (I) as follows:

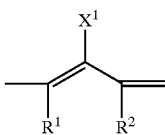

formula (I)

wherein $X^1$ represents a halogen atom or $X^2$—$L^1$; $X^2$ represents an oxygen atom or a sulfur atom; $L^1$ represents a hydrocarbon group having from 1 to 12 carbon atoms; and $R^1$ and $R^2$ each independently represents a hydrocarbon group having from 1 to 12 carbon atoms, and $R^1$ and $R^2$ may bind together to form a ring structure.

3. The negative-type image recording material according to claim 2, wherein in the formula (I), $X^1$ represents a halogen atom.

4. The negative-type image recording material according to claim 2, wherein in the formula (I), $X^1$ represents $X^2$—$L^1$ and $X^2$ represents an oxygen atom.

5. The negative-type image recording material according to claim 2, wherein in the formula (I), $X^1$ represents $X^2$—$L^1$ and $X^2$ represents a sulfur atom.

6. The negative-type image recording material according to claim 1, wherein the infrared absorbent (A) includes at least one type of cyanine dyes represented by a formula (II) as follows:

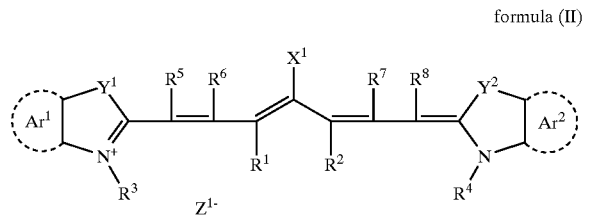

formula (II)

wherein $X^1$ represents a halogen atom or $X^2$—$L^1$; $X^2$ represents an oxygen atom or a sulfur atom; $L^1$ represents a hydrocarbon group having from 1 to 12 carbon atoms; $R^1$ and $R^2$ each independently represents a hydrocarbon group having from 1 to 12 carbon atoms, and $R^1$ and $R^2$ may bind together to form a ring structure; $Ar^1$ and $Ar^2$, which are the same or different, each represents an aromatic hydrocarbon group which may have a substituent; $Y^1$ and $Y^2$, which are the same or different, each represents a sulfur atom or a dialkylmethylene group having no more than 12 carbon atoms; $R^3$ and $R^4$, which are the same or different, each represents a hydrocarbon group having no more than 20 carbon atoms, which may have a substituent; $R^5$, $R^6$, $R^7$, and $R^8$, which are the same or different, each represents a hydrogen atom or a hydrocarbon group having no more than 12 carbon atoms; and $Z^1$ represents a counter anion; and if any one of $R^1$ to $R^8$ is substituted by a sulfo group, formula (II) is devoid of $Z^1$.

7. The negative-type image recording material according to claim 6, wherein in the formula (II), $Ar^1$ and $Ar^2$, which are the same or different, each represents a benzene ring or a naphthalene ring.

8. The negative-type image recording material according to claim 6, wherein in the formula (II), $Ar^1$ and $Ar^2$, which are the same or different, each represents a benzene ring or a naphthalene ring, which has a substituent.

9. The negative-type image recording material according to claim 6, wherein in the formula (II), $Y^1$ and $Y^2$ each represents a sulfur atom.

10. The negative-type image recording material according to claim 6, wherein in the formula (II), $Y^1$ and $Y^2$, which are the same or different, each represents a dialkylmethylene group having no more than 12 carbon atoms.

11. The negative-type image recording material according to claim 6, wherein in the formula (II), $Z^1$ represents a halogen ion, a perchlorate ion, a tetrafluoroborate ion, a hexafluorophosphate ion, or a sulfonate ion.

12. The negative-type image recording material according to claim 11, wherein in the formula (II), $Z^1$ represents a perchlorate ion, a hexafluorophosphate ion, or an arylsulfonate ion.

13. The negative-type image recording material according to claim 1, wherein the sulfonium salt is represented by a formula (V) as follows:

Formula (V)

wherein $R^{31}$, $R^{32}$, and $R^{33}$, which may be the same or different, each represents a hydrocarbon group having not more than 20 carbon atoms, which may have a substituent; and $Z^{31}$ represents the counter ion same as that of $Z^{11}$.

14. A negative-type lithographic printing plate precursor, comprising a support having formed thereon a photosensitive layer containing (a) an infrared absorbent, (b) a sulfonium salt, (c) a radical polymerizing compound, and (d) a binder polymer, wherein absorbance of the photosensitive layer at a wavelength of maximum absorption in a range of wavelengths of from 760 nm to 1200 nm is in a range of from 0.5 to 1.2 according to a reflection measurement technique.

15. The negative-type lithographic printing plate precursor according to claim 14, wherein the infrared absorbent is a dye or a pigment having a wavelength of maximum absorption in the range of wavelengths of from 760 nm to 1200 nm.

16. The negative-type lithographic printing plate precursor according to claim 14, wherein the infrared absorbent is a dye selected from the group consisting of azo dyes, metal complex salt azo dyes, pyrazolone azo dyes, naphthoquinone dyes, anthraquinone dyes, phthalocyanine dyes, carbonium dyes, quinoimine dyes, methine dyes, squarylium dyes, pyrylium salts, and dyes of metal thiolate complexes.

17. The negative-type lithographic printing plate precursor according to claim 14, wherein the infrared absorbent is a cyanine dye.

18. The negative-type lithographic printing plate precursor according to claim 17, wherein the infrared absorbent includes at least one cyanine dye represented by following formula (II) as follows:

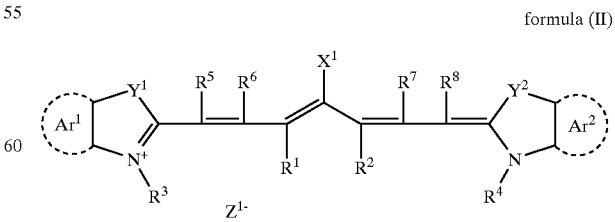

formula (II)

wherein $X^1$ represents a halogen atom or $X^2$—$L^1$; $X^2$ represents an oxygen atom or a sulfur atom and $L^1$ represents a hydrocarbon group having from 1 to 12 carbon atoms; $R^1$ and $R^2$ each independently represents a hydrocarbon group having from 1 to 12 carbon atoms, and $R^1$ and $R^2$ may bind together to form a ring structure; $Ar^1$ and $Ar^2$, which are the same or different, each represents an aromatic hydrocarbon group which may have a substituent; $Y^1$ and $Y^2$, which are the same or different, each represents a sulfur atom or a dialkylmethylene group having no more than 12 carbon atoms; $R^3$ and $R^4$, which are the same or different, each represents a hydrocarbon group having no more than 20 carbon atoms, which may have a substituent; $R^5$, $R^6$, $R^7$, and $R^8$, which are the same or different, each represents a hydrogen atom or a hydrocarbon group having no more than 12 carbon atoms; and $Z^1$ represents a counter anion; and if any one of $R^1$ to $R^8$ is substituted by a sulfo group, formula II is devoid of $Z^1$.

19. The negative-type lithographic printing plate precursor according to claim 18, wherein in the formula (II), $Ar^1$ and $Ar^2$, which are the same or different, each represents a benzene ring or a naphthalene ring, which has a substituent.

20. The negative-type lithographic printing plate precursor according to claim 18, wherein in the formula (II), $Y^1$ and $Y^2$ each represents a sulfur atom.

21. The negative-type lithographic printing plate precursor according to claim 18, wherein in the formula (II), $Y^1$ and $Y^2$, which are the same or different, each represents a dialkylmethylene group having no more than 12 carbon atoms.

22. The negative-type image recording material according to claim 14, wherein the sulfonium salt is represented by a formula (V) as follows:

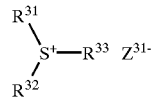

Formula (V)

wherein $R^{31}$, $R^{32}$, and $R^{33}$, which may be the same or different, each represents a hydrocarbon group having not more than 20 carbon atoms, which may have a substituent; and $Z^{31}$ represents the counter ion same as that of $Z^{11}$.

* * * * *